United States Patent
Goto et al.

(10) Patent No.: US 10,939,598 B2
(45) Date of Patent: Mar. 2, 2021

(54) CONTROL DEVICE AND CONTROL METHOD FOR REDUCING A POSITION ERROR OF A COMPONENT MOUNTING MACHINE

(71) Applicant: FUJI CORPORATION, Chiryu (JP)

(72) Inventors: Hidenori Goto, Chiryu (JP); Yusuke Yamakage, Anjo (JP); Masataka Iwasaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 326 days.

(21) Appl. No.: 15/580,879

(22) PCT Filed: Jun. 10, 2015

(86) PCT No.: PCT/JP2015/066730
§ 371 (c)(1),
(2) Date: Dec. 8, 2017

(87) PCT Pub. No.: WO2016/199241
PCT Pub. Date: Dec. 15, 2016

(65) Prior Publication Data
US 2018/0177088 A1  Jun. 21, 2018

(51) Int. Cl.
*H05K 13/04* (2006.01)
*H05K 13/08* (2006.01)

(52) U.S. Cl.
CPC ....... *H05K 13/0452* (2013.01); *H05K 13/089* (2018.08); *H05K 13/0853* (2018.08)

(58) Field of Classification Search
CPC ........... H05K 13/0452; H05K 13/0853; H05K 13/089
See application file for complete search history.

(56) References Cited

U.S. PATENT DOCUMENTS 6,314,640 B1    11/2001  Yoshida et al.
6,718,626 B2 *   4/2004  Kawada ............. H05K 13/0452
                                                        29/740
(Continued)

FOREIGN PATENT DOCUMENTS

JP    5-16332 A    1/1993
JP    6-137449 A   5/1994
(Continued)

OTHER PUBLICATIONS

Extended European Search Report dated May 14, 2018 in European Patent Application No. 15894926.3, 7 pages.
(Continued)

*Primary Examiner* — Minh N Trinh
(74) *Attorney, Agent, or Firm* — Oblon, McClelland, Maier & Neustadt, L.L.P.

(57) ABSTRACT

To provide a control device and a control method of a component mounting machine which is capable of improving the accuracy of mounting control. In a case where the holding member is moved from a current position to a predetermined processing position within the component mounting machine, the control device of the component mounting machine moves a holding member to a preparation position which is set to a defined propelling direction and distance with respect to the processing position, and then moves the holding member from the preparation position to a mounting position.

10 Claims, 8 Drawing Sheets

(56) References Cited

U.S. PATENT DOCUMENTS

| | | |
|---|---|---|
| 6,915,565 B2 | 7/2005 | Isogai et al. |
| 10,231,370 B2 * | 3/2019 | Hayashi ................ H05K 13/046 |
| 10,477,750 B2 * | 11/2019 | Kubota ................ H05K 13/046 |
| 2002/0011000 A1 | 1/2002 | Yoshida et al. |
| 2002/0108239 A1 | 8/2002 | Isogai et al. |
| 2003/0026640 A1 | 2/2003 | Moore et al. |
| 2006/0200974 A1 | 9/2006 | Yoshida et al. |
| 2016/0174425 A1 | 6/2016 | Hayashi et al. |

FOREIGN PATENT DOCUMENTS

| | | |
|---|---|---|
| JP | 6-343000 A | 12/1994 |
| JP | 10-190294 A | 7/1998 |
| JP | 2003-106430 A | 4/2003 |
| JP | 2006-336785 A | 12/2006 |
| JP | 2007-281312 | 10/2007 |
| JP | 2008-205156 A | 9/2008 |
| JP | 2014-86667 A | 5/2014 |
| JP | 2014-192301 A | 10/2014 |
| WO | WO 2015/015578 A1 | 2/2015 |

OTHER PUBLICATIONS

International Search Report dated Sep. 15, 2015, in PCT/JP2015/066730, filed Jun. 10, 2015.

* cited by examiner

[Fig. 1]
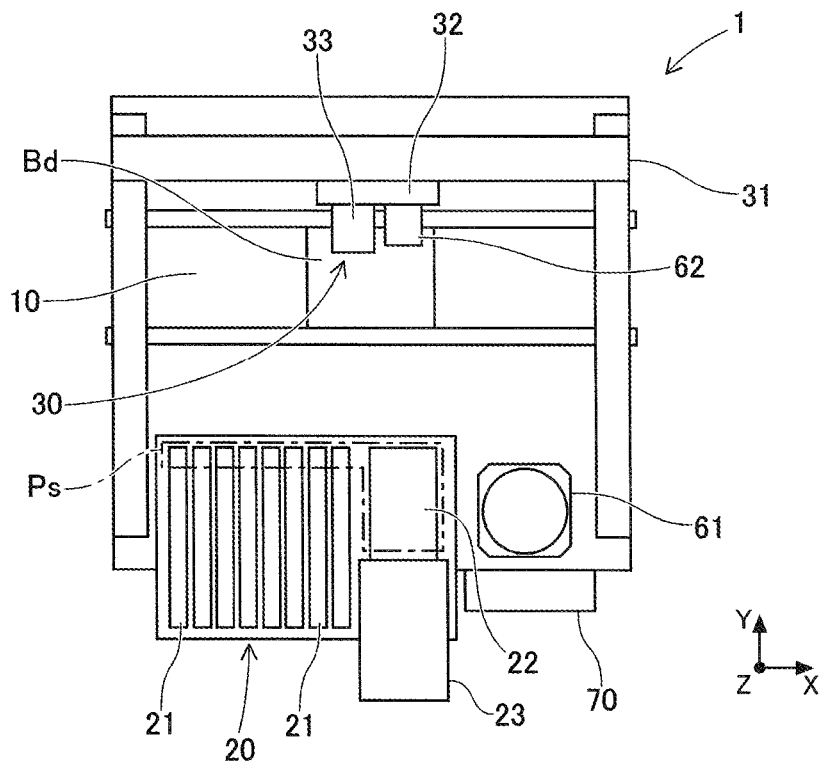
[Fig. 2]
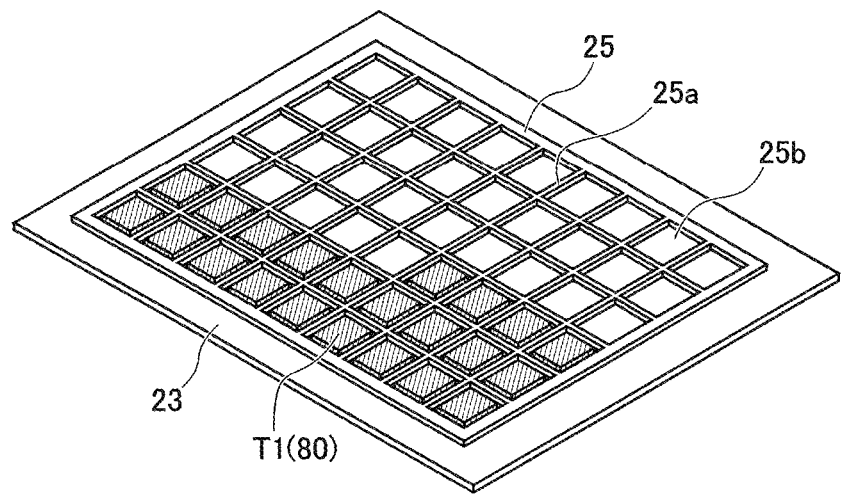

[Fig. 3]
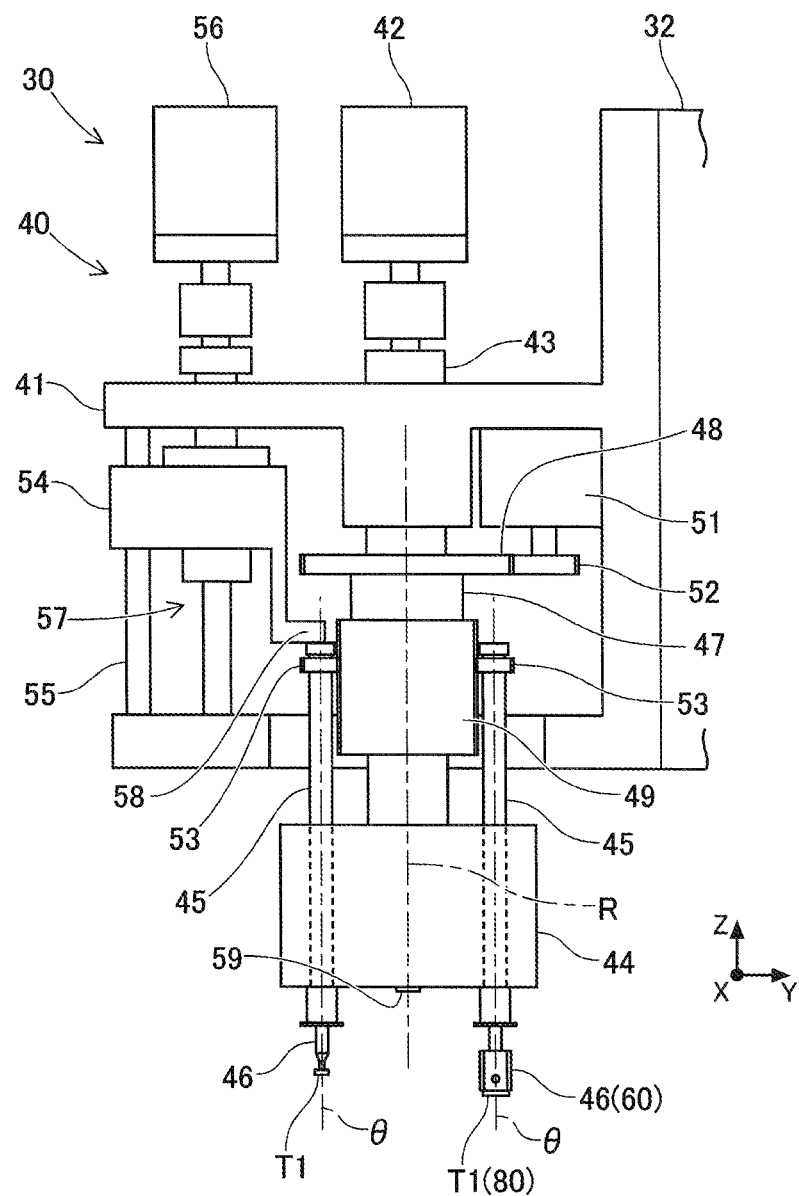

[Fig. 4]
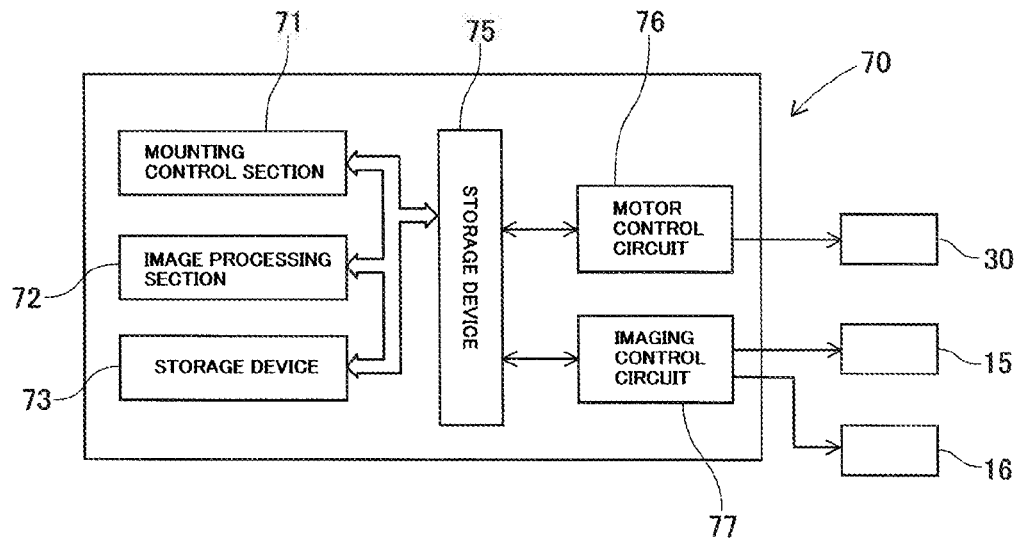
[Fig. 5]
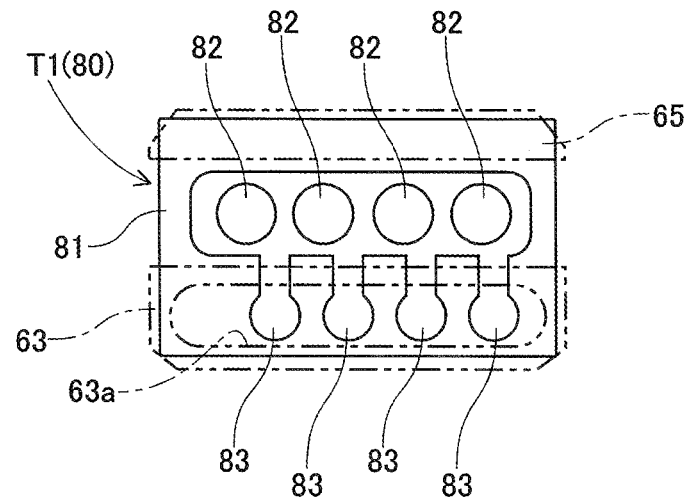

[Fig. 6]
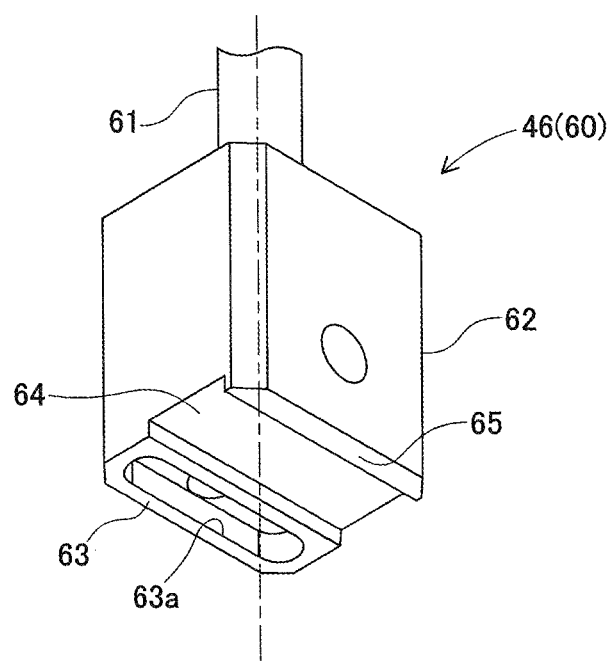

[Fig. 7]
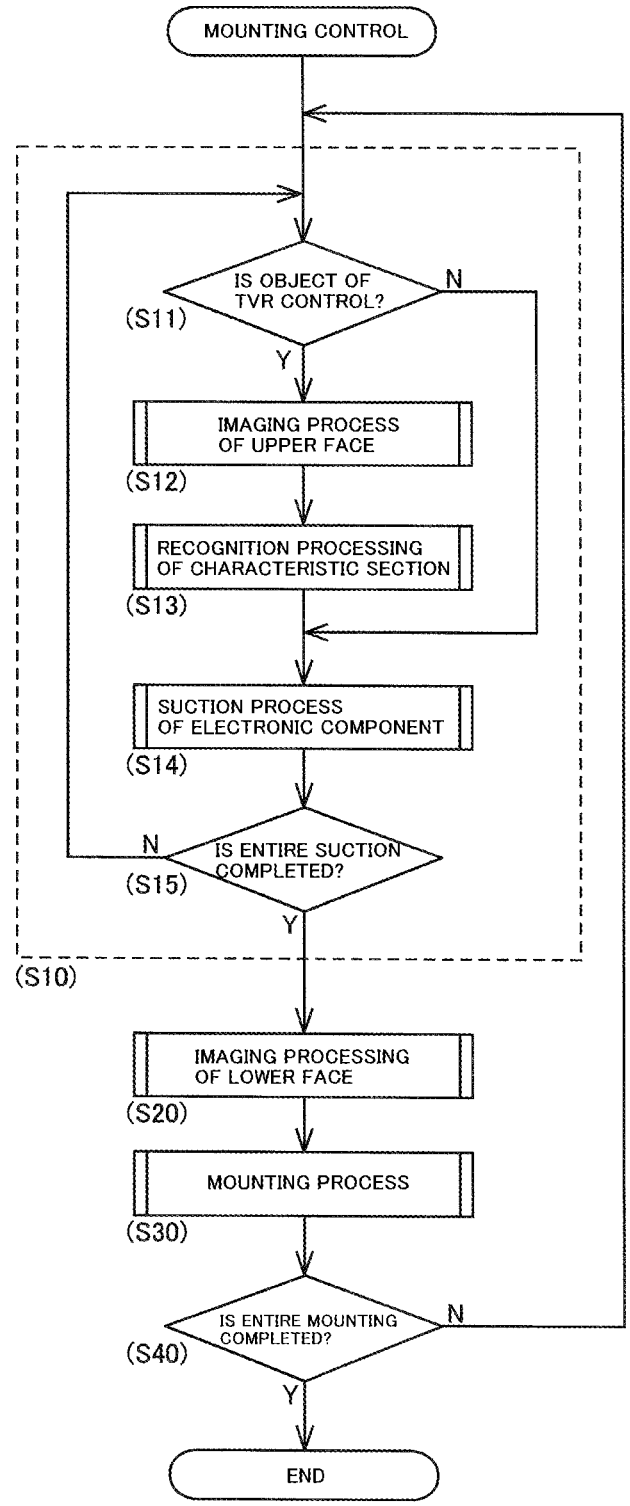

[Fig. 8]
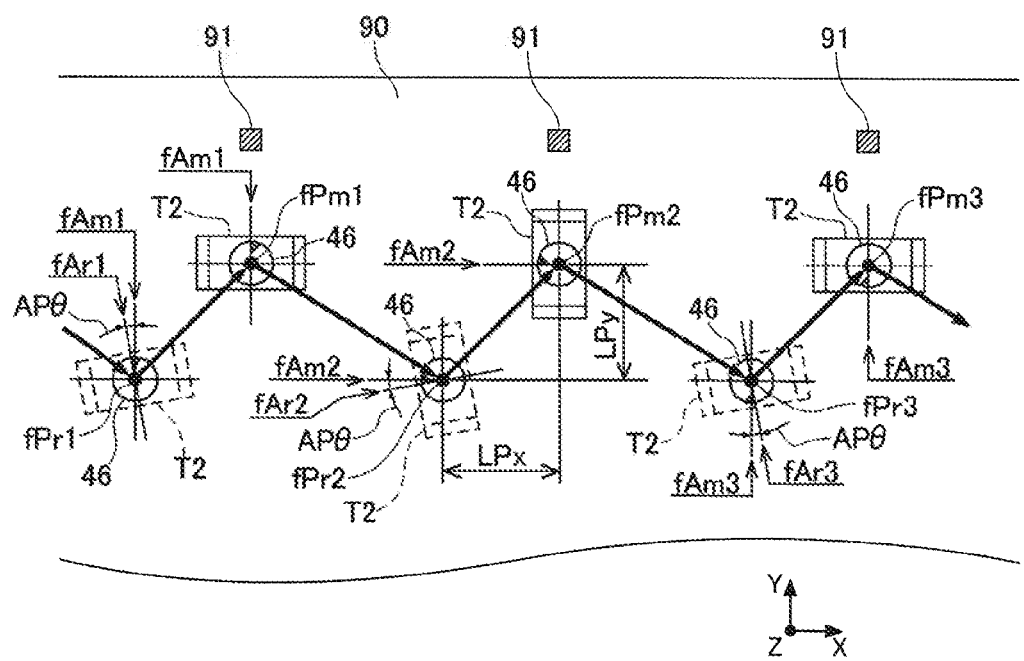

[Fig. 9]
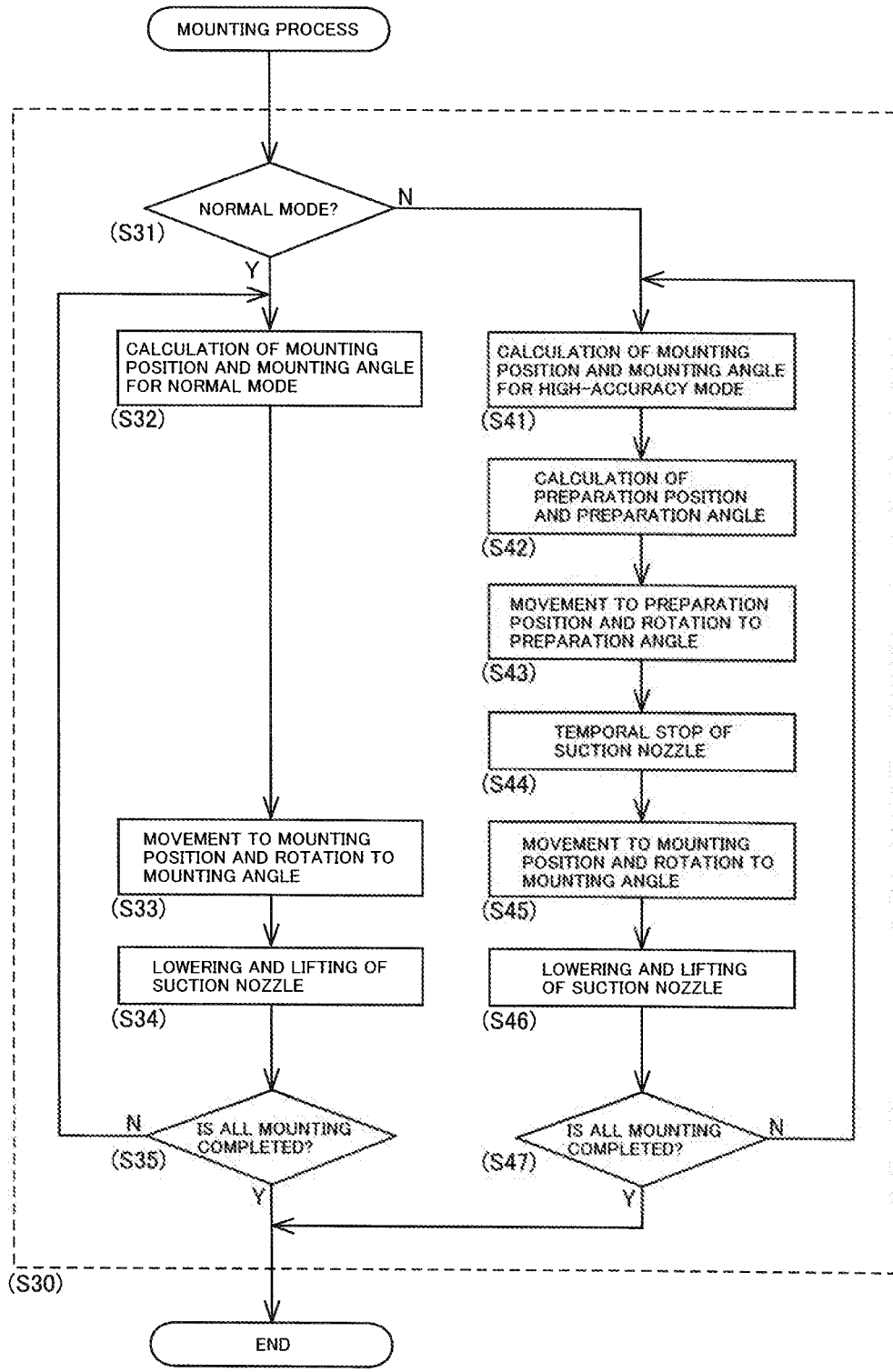

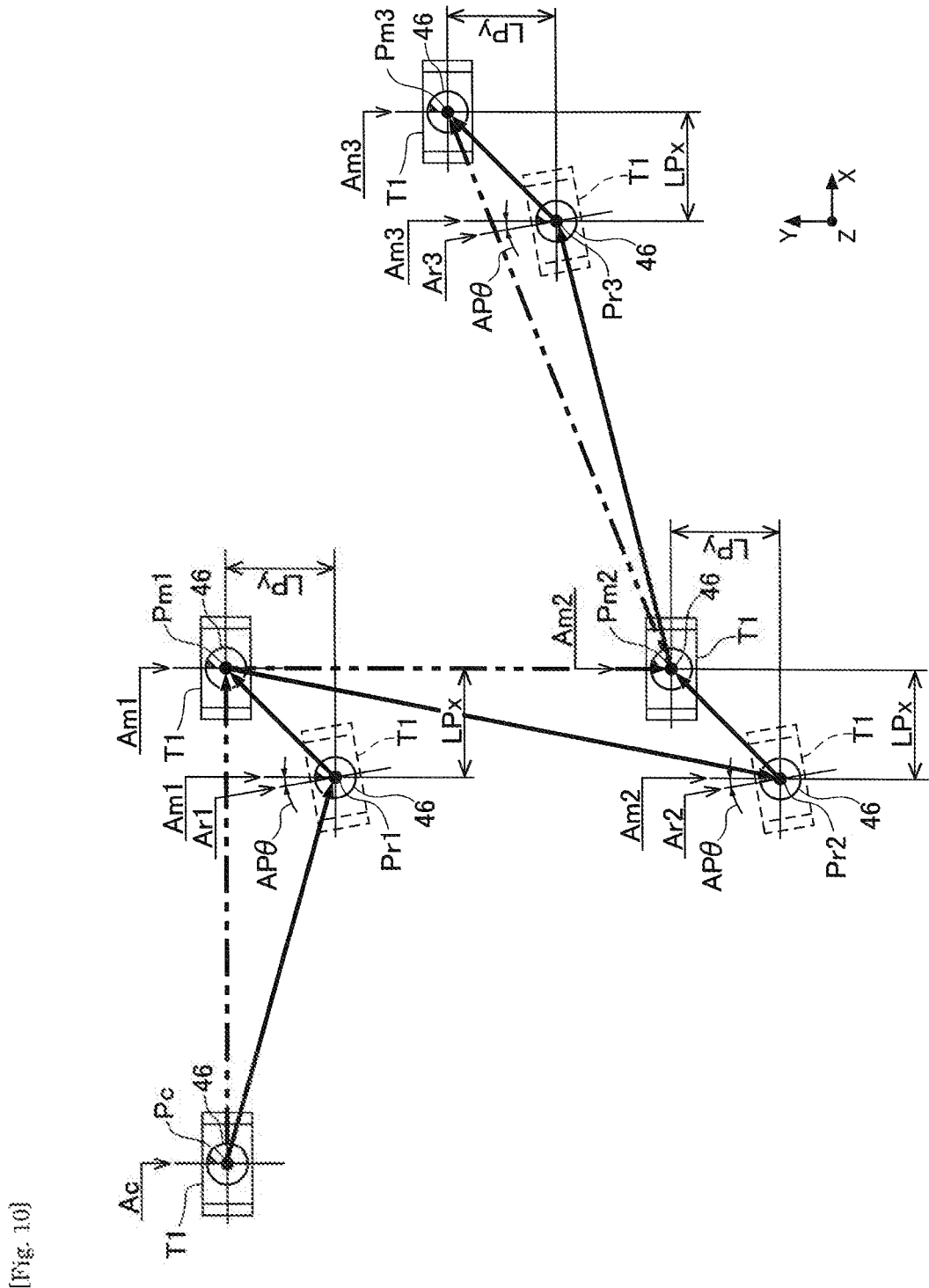
[Fig. 10]

CONTROL DEVICE AND CONTROL METHOD FOR REDUCING A POSITION ERROR OF A COMPONENT MOUNTING MACHINE

TECHNICAL FIELD

The present disclosure relates to a control device and a control method applied to a component mounting machine that mounts an electronic component on a circuit board.

BACKGROUND ART

A component mounting machine includes a driving device that constitutes a linear motion mechanism for moving a holding member that holds an electronic component or a pivoting mechanism for rotating the holding member. The component mounting machine is affected by mounting control by backlash or a lost motion in the driving device. Therefore, the control device of the component mounting machine performs calibration processing in advance as disclosed in, for example, PTL 1. The control device of the component mounting machine calibrates an operation of the driving device in the mounting control based on a result of the calibration processing to reduce the influence of the backlash or the like.

CITATION LIST

Patent Literature

PTL 1: JP-A-2014-86687

BRIEF SUMMARY

Problem to be Solved

However, even in the mounting control using the result of the calibration processing as described above, the influence due to the backlash and the lost motion remarkably remains. On the other hand, for the mounting control of the component mounting machine, for example, in order to downsize a circuit board product, it is desired to mount the electronic components with high density and high accuracy.

The present disclosure is made in view of the above-described circumstances and an object of the present disclosure is to provide a control device and a control method of a component mounting machine which is capable of improving the accuracy of mounting control.

Means for Solving the Problem

A control device of a component mounting machine according to an embodiment is applied to the component mounting machine that holds an electronic component supplied to a supply position by a holding member and transfers the electronic component to a mounting position on a circuit board, and controls a moving operation of the holding member. In a case where the holding member is moved from a current position to a predetermined processing position within the component mounting machine, the control device causes the holding member to move to a preparation position which is set to a defined propelling direction and distance with respect to the processing position, and then moves the holding member from the preparation position to the processing position.

A control device of a component mounting machine according to an embodiment is applied to the component mounting machine that holds an electronic component supplied to a supply position by a holding member and transfers the electronic component to a mounting position on a circuit board, and controls a rotation operation of the holding member. In a case where the holding member is rotated from a current angle to a predetermined processing angle, the control device causes the holding member to rotate to a preparation angle which is set to a defined rotational direction and angle with respect to the processing angle, and then causes the holding member to rotate from the preparation angle to the processing angle.

A control method of a component mounting machine according to an embodiment is applied to the component mounting machine that holds an electronic component supplied to a supply position by a holding member and transfers the electronic component to a mounting position on a circuit board, and controls a moving operation of the holding member. In a case where the holding member is moved from a current position to a predetermined processing position within the component mounting machine, the control device causes the holding member to move to a preparation position which is set to a defined propelling direction and distance with respect to the processing position, and then moves the holding member from the preparation position to the processing position.

A control method of a component mounting machine according to an embodiment is applied to the component mounting machine that holds an electronic component supplied to a supply position by a holding member and transfers the electronic component to a mounting position on a circuit board, and controls a rotation operation of the holding member. In a case where the holding member is rotated from a current angle to a predetermined processing angle, the control device causes the holding member to rotate to a preparation angle which is set to a defined rotational direction and angle with respect to the processing angle, and then causes the holding member to rotate from the preparation angle to the processing angle.

Advantageous Effects

According to the configurations of the disclosure, the holding member passes through the preparation position when moving from the current position to the mounting position. Therefore, the movement amount of the holding member when moving from the preparation position to the mounting position is a fixed amount in accordance with the distance of the defined propelling direction. Therefore, a position error generated by backlash or the like at the mounting position after the movement is reduced. Therefore, it is possible to improve accuracy of mounting control by mounting control using a calibration value for calibrating the position error.

According to the configurations of the disclosure, the holding member passes through the preparation angle when rotating from the current angle to the mounting angle. Therefore, the rotation of the holding member from the preparation angle to the mounting angle is in a fixed amount in accordance with the angle of the defined rotational direction. Therefore, an angle error generated by backlash or the like at the mounting angle of the holding member after the rotation is reduced. Therefore, it is possible to improve accuracy of mounting control by mounting control using the calibration value for calibrating the angle error.

BRIEF DESCRIPTION OF DRAWINGS

FIG. 1 is a plan view illustrating an entire component mounting machine in an embodiment.

FIG. 2 is a perspective view of a pallet in FIG. 1.

FIG. 3 is a view illustrating a mounting head in FIG. 1.

FIG. 4 is a block diagram illustrating a control device of the component mounting machine.

FIG. 5 is a top view illustrating a LED suction nozzle as well on an upper face of an LED element.

FIG. 6 is an enlarged perspective view illustrating a LED element dedicated nozzle in FIG. 3.

FIG. 7 is a flowchart illustrating mounting control by the component mounting machine.

FIG. 8 is a view illustrating an action trajectory of the suction nozzle in calibration processing.

FIG. 9 is a flowchart illustrating a mounting process by the component mounting machine.

FIG. 10 is a view illustrating an action trajectory of the suction nozzle in a mounting process of a high-accuracy mode.

DETAILED DESCRIPTION

Hereinafter, preferred embodiments of a control device and a control method of a component mounting machine of the disclosure will be described with reference to the drawings. The component mounting machine is an apparatus that performs mounting of an electronic component by holding the electronic component supplied to a supply position with a holding member and transferring the electronic component at a predetermined mounting position on a circuit board.

Embodiments

1. Entire Configuration of Component Mounting Machine 1

As illustrated in FIG. 1, a component mounting machine 1 includes a board conveyance device 10, a component supply device 20, a component transfer device 30, a component camera 15, a board camera 16, and a control device 70. In the following description, a horizontal width direction of the component mounting machine 1 is referred to as an X-axis direction (left-right direction of FIG. 1), a horizontal longitudinal direction (up-down direction of FIG. 1) of the component mounting machine 1 is referred to as a Y-axis direction, and a vertical direction (front-rear direction of FIG. 1) perpendicular to an X-axis and a Y-axis is referred to as a Z-axis direction.

(1-1. Board Conveyance Device 10)

The board conveyance device 10 is configured of a belt conveyor or the like, and sequentially conveys a circuit board Bd in a conveyance direction. The board conveyance device 10 positions the circuit board Bd at a predetermined position within the component mounting machine 1. The board conveyance device 10 conveys the circuit board Bd to an outside of the component mounting machine 1 after mounting control is executed by the component mounting machine 1.

(1-2. Component Supply Device 20)

The component supply device 20 supplies the electronic component mounted on the circuit board Bd at a supply position Ps. The component supply device 20 has multiple slots disposed side by side in the X-axis direction. A feeder 21 is detachably set in each of the multiple slots. The component supply device 20 feeds and moves a carrier tape by the feeder 21, and supplies the electronic component at a pickup section positioned on a leading end side (upper side of FIG. 1) of the feeder 21.

In addition, the component supply device 20 supplies, for example, relatively large-sized electronic components such as lead components in a state where the electronic components are arranged on a tray 25 placed on a pallet 22. In the component supply device 20, multiple the pallets 22 are stored in a storage rack 23 partitioned in the up-down direction and a predetermined tray pallet is drawn out in accordance with the mounting control to supply the electronic component such as the lead component. As illustrated in FIG. 2, the tray 25 is provided with partitions 25a in a lattice shape and a large number of pockets 25b are formed. One LED element 80 that is, for example, the electronic component is stored in the pocket 25b of the tray 25. In addition, in addition to the above, the component supply device 20 may adopt a configuration in which the electronic component is supplied in a state where the electronic component supplied by the feeder 21 is temporarily placed on a temporary placement table.

(1-3. Component Transfer Device 30)

The component transfer device 30 is configured to be movable in the X-axis direction and in the Y-axis direction. The component transfer device 30 is disposed from a rear side (upper side of FIG. 1) of the component mounting machine 1 in a longitudinal direction to the upper side of the component supply device 20 on a front side. The component transfer device 30 includes a head driving device 31, a moving table 32, and a mounting head 40. The head driving device 31 is configured such that the moving table 32 is capable of moving in an XY-axis (propelling axis) direction by a linear motion mechanism.

As illustrated in FIG. 3, the mounting head 40 includes a head main body 41 which is clamped and fixed to the moving table 32. An index shaft 43 that indexes a rotation angle by an R-axis motor 42 at a predetermined angle is rotatably supported by the head main body 41. A tool main body 44 is fixed to a lower end of the index shaft 43.

The tool main body 44 holds a plurality (for example, twelve) of nozzle holders 45 slidably and rotatably in the Z-axis direction at equal intervals in the circumferential direction on a circumference concentric with an R-axis (rotation axis). The nozzle holder 45 is urged upward with respect to the tool main body 44 by an elastic force of a spring (not illustrated). Therefore, the nozzle holder 45 is positioned at a lifting end in a normal state in which no the external force is applied.

A suction nozzle 46 of a type selected according to an electronic component T1 of the mounting object is detachably held at a lower end portion of the nozzle holder 45. The suction nozzle 46 is a holding member that sucks and holds the electronic component T1 by a negative pressure air supplied from a negative pressure air supply device (not illustrated) via an air passage. The tool main body 44 rotates via the index shaft 43 according to driving of the R-axis motor 42 so that the suction nozzle 46 is sequentially indexed to a predetermined angle position (for example, a lifting and lowering position where the nozzle holder 45 is capable of lifting and lowering) around the R-axis.

A cylindrical rotating body 47 is disposed on an outer peripheral side of the index shaft 43 to be relatively rotatable with respect to the index shaft 43. The rotating body 47 is provided with a θ-axis intermediate gear 48 and a θ-axis cylindrical gear 49 coaxially. The θ-axis intermediate gear 48 meshes with a θ-axis driving gear 52 fixed to an output shaft of a θ-axis motor 51 provided in the head main body 41. An external gear having a tooth width having a predetermined length in an axial line direction (R-axis direction) of the rotating body 47 is formed in the θ-axis cylindrical gear 49.

A nozzle gear 53 is formed at an upper end portion of the nozzle holder 45. The nozzle gear 53 slidably meshes with the θ-axis cylindrical gear 49 in the R-axis direction, which is supported on the outer peripheral side of the index shaft 43 to be relatively rotatable. The θ-axis intermediate gear 48, the θ-axis cylindrical gear 49, the θ-axis motor 51, the θ-axis driving gear 52, and the nozzle gear 53 configure a pivoting mechanism in the mounting head 40. The suction nozzle 46 rotates integrally with the nozzle holder 45 around the θ-axis (rotation axis) by the pivoting mechanism and controls a rotation angle or a rotation speed.

In addition, the head main body 41 is provided with a nozzle actuating member 54. The nozzle actuating member 54 is slidably guided by a guide bar 55 in the up-down direction (Z-axis direction). A Z-axis motor 56 fixed to the head main body 41 drives a ball screw mechanism 57. The nozzle actuating member 54 is lifted and lowered in the Z-axis direction by driving of the ball screw mechanism 57.

The nozzle actuating member 54 has a nozzle lever 58 abutting against an upper end portion of the nozzle holder 45 indexed to the lifting and lowering position around the R-axis among the multiple the nozzle holders 45. The nozzle lever 58 is lowered as the nozzle actuating member 54 moves downward in the Z-axis direction and presses the abutting nozzle holder 45 downward in the Z-axis direction. The nozzle actuating member 54, the guide bar 55, the Z-axis motor 56, the ball screw mechanism 57, and the nozzle lever 58 configure a lifting and lowering mechanism in the mounting head 40. The suction nozzles 46 are integrally lifted and lowered in the Z-axis direction by the operation of the lifting and lowering mechanism and a position or a movement speed in the Z-direction is controlled.

In addition, a fiducial mark 59 is attached to a defined position on a lower face of the tool main body 44. The fiducial mark 59 indicates a fiducial position of the mounting head 40 in image data acquired by imaging the electronic component T1 held by the suction nozzle 46 by the component camera 15 which is described later. The fiducial mark 59 has, for example, a circular portion having a predetermined diameter and is set to have a shape and a dimension occupying a defined range in the visual field of the camera of the component camera 15.

(1-4. Component Camera 15 and Board Camera 16)

The component camera 15 and the board camera 16 are digital imaging devices having imaging devices such as a Charge Coupled Device (CCD) or a Complementary Metal Oxide Semiconductor (CMOS). The component camera 15 and the board camera 16 perform imaging within a range that falls within the visual field of the camera based on a control signal from the control device 70 which is communicably connected and feeds the image data acquired by the imaging to the control device 70.

The component camera 15 is fixed to a base of the component mounting machine 1 and is configured to be capable of imaging from below the component transfer device 30 so that an optical axis faces upward in the vertical direction (Z-axis direction). More specifically, the component camera 15 is configured to be capable of imaging the lower face of the electronic component T1 in a state of being held by the suction nozzle 46. Specifically, a lens unit of the component camera 15 set so that it is focused on a target object located at a certain distance from the imaging device. In addition, the visual field of the camera of the lens unit of the component camera 15 is set within a range in which all the suction nozzle 46 and the fiducial mark 59 supported by the mounting head 40 are accommodated.

The board camera 16 is provided on a moving table 32 of the component transfer device 30 so that the optical axis faces downward in the vertical direction (Z-axis direction). The board camera 16 is configured to be capable of imaging the circuit board Bd. The control device 70, which acquires the image data from the board camera 16, recognizes a positioning state of the circuit board Bd by the board conveyance device 10 by recognizing, for example, a positioning mark attached to the board by an image processing. The control device 70 corrects the position of the suction nozzle 46 according to the positioning state of the circuit board Bd and controls a mounting process so as to mount the electronic component T1.

(1-5. Control Device 70)

The control device 70 is mainly constituted by a CPU, various memories, and a control circuit, and controls mounting of the electronic component T1 on the circuit board Bd based on a control program for operating the component mounting machine 1 and the image data acquired by imaging of the component camera 15 and the board camera 16. As illustrated in FIG. 4, in the control device 70, an input and output interface 75 is connected to a mounting control section 71, an image processing section 72, and a storage device 73 via a bus. The input and output interface 75 is connected to a motor control circuit 76 and an imaging control circuit 77.

The mounting control section 71 controls a position of the mounting head 40 or an operation of the suction mechanism via the motor control circuit 76. More specifically, the mounting control section 71 inputs information output from multiple various sensors provided in the component mounting machine 1 and results of various recognition processes. The mounting control section 71 feeds a control signal to the motor control circuit 76 based on the control program stored in the storage device 73, control information which is described later, information by various sensors, and results of an image processing and recognition processing. Therefore, the position and the rotation angle of the suction nozzle 46 supported by the mounting head 40 are controlled.

The image processing section 72 acquires the image data by imaging of the component camera 15 and the board camera 16 via the imaging control circuit 77, and executes the image processing according to application. The image processing may include, for example, binarization of the image data, filtering, hue extraction, super-resolution processing, or the like. The storage device 73 is constituted by, for example, an optical drive device such as a hard disk device, a flash memory, or the like. The storage device 73 stores a control program, control information, image data, temporal data of processing by the image processing section 72, or the like.

The input and output interface 75 is interposed between the CPU or the storage device 73 and each of control circuits 76 and 77, and adjusts data format conversion and signal strength. The motor control circuit 76 controls driving of each propelling axis (XYZ-axis) motor and each rotation axis (Rθ-axis) motor provided in the component transfer device 30 based on the control signal by the mounting control section 71.

The moving table 32 is positioned in each propelling axis direction, planar positions (positions in XY-axis direction) of the suction nozzle 46 and the board camera 16 supported by the moving table 32 are indexed, and a height position (position in the Z-axis direction) of the suction nozzle 46 is indexed by control of each propelling axis motor by the mounting control section 71. In addition, the pivoting position (R-axis rotation angle and θ-axis rotation angle) of the suction nozzle 46 is indexed by the control of each rotation axis motor by the mounting control section 71.

The imaging control circuit 77 controls imaging by the component camera 15 and the board camera 16 based on the control signal of imaging by the CPU of the control device 70 or the like. In addition, the imaging control circuit 77 acquires the image data by imaging of the component camera 15 and the board camera 16, and stores the image data in the storage device 73 via the input and output interface 75.

2. Detailed Configuration of Suction Nozzle 46

(2-1. Outline of Suction Nozzle 46 and Electronic Component T1)

As described above, the type of the suction nozzle 46 is selected according to the electronic component T1 of a mounting object and is attached to and held by the lower end portion of the nozzle holder 45. The electronic components T1 include small-sized components stored in the carrier tape loaded in the feeder 21, relatively large-sized lead components supplied in a state of being placed side by side on the tray 25 or the temporary placement table, and the LED elements 80.

(2-2. LED Element 80 and Dedicated Nozzle 60)

As illustrated in FIG. 5, the LED element 80 includes a component main body 81, multiple light emitting sections 82, and multiple electrode sections 83. The component main body 81 is formed in a flat plate shape. The multiple the light emitting sections 82 are disposed linearly side by side on an upper face of the component main body 81. Each of the multiple the electrode sections 83 is formed on the upper face of the component main body 81 so as to be capable of supplying power corresponding to the multiple the light emitting sections 82.

Here, the suction nozzle 46 sucks the upper face of the electronic component T1 by the negative pressure air supplied from the negative pressure air supply device to hold the electronic component T1. On the upper face of the electronic component T1, the suction position to be in contact with and sucked by the suction nozzle 46 is appropriately set for each component type based on a shape of the upper face or the like. In addition, in order to hold the electronic component T1 in an appropriate posture, for example, it is desirable that the electronic component T1 is held by suction at the suction position which is set at a portion close to a centroid position of the electronic component T1 on the upper face of the electronic component T1.

However, since the portion which is set at the suction position on the upper face of the electronic component T1 is in contact with a leading end of the suction nozzle 46, when the electronic component T1 is mounted on the circuit board Bd, a certain degree of load (pressing force) is received from the suction nozzle 46. Therefore, in a case where a portion with low withstand load is present on the upper face of the electronic component T1, the suction position of the electronic component T1 may be set at a position eccentric from the center of the outer shape or the centroid position of the electronic component T1.

Here, the LED element 80 is configured such that the centroid position is in the vicinity of the center of the outer shape and the light emitting section 82 is disposed at the position. For the light emitting section 82 of the LED element 80, a transparent material such as glass is used at the outermost thereof and has a lower withstand load than that of the component main body. Therefore, if the LED element 80 is held by being in contact with the ordinary suction nozzle 46 in the vicinity of the center of the outer shape, there is a concern that a load exceeding the withstand load from the suction nozzle 46 when being mounted on the circuit board Bd. Therefore, the suction position of the LED element 80 is set at a position (specifically, the upper face excluding the light emitting section 82) eccentric from the center of the outer shape.

However, when such an LED element 80 is sucked by using the ordinary suction nozzle 46 at the suction position which is set eccentric from the center of the outer shape, there is a concern that the LED element 80 is inclined or when the LED element 80 is mounted, the pressing force to the circuit board Bd is insufficient. Therefore, in the embodiment, in a case where there is the electronic component T1 whose suction position is set eccentric therefrom as the mounting object is the LED element 80, the dedicated suction nozzle (hereinafter, referred to as the "dedicated nozzle") is applied.

As illustrated in FIG. 6, the dedicated nozzle 60 includes a cylindrical section 61, a nozzle main body 62, a suction surface 63, a retraction section 64, and an auxiliary surface 65. The cylindrical section 61 is formed in a hollow tubular shape and is a portion that is detachably attached to the lower end portion of the nozzle holder 45. The nozzle main body 62 is formed in a block shape as a whole shape. In the embodiment, a cross section of the nozzle main body 62 orthogonal to the θ-axis is set to be larger than the upper face of the LED element 80. An air passage communicating with the cylindrical section 61 is formed inside the nozzle main body 62.

The suction surface 63 is a part of the lower face of the nozzle main body 62 and is positioned to be away from an axial center of the cylindrical section 61 in a radial direction. In addition, the suction surface 63 is formed with an oval opening section 63a. The opening section 63a is connected to the cylindrical section 61 via the air passage formed inside the nozzle main body 62 so that the negative pressure air can flow therethrough. In the embodiment, multiple the suction surfaces 63 may be formed on the lower face of the nozzle main body 62. In this case, the negative pressure air is connected to the opening section 63a of each of the suction surfaces 63 to be capable of flowing via the air passage branching inside the nozzle main body 62.

The retraction section 64 is a part of the lower face of the nozzle main body 62 and is formed in a groove shape which is recessed toward the cylindrical section 61 side with respect to the suction surface 63. A groove width of the retraction section 64 is set to be wider than a width of the light emitting section 82 of the LED element 80. The auxiliary surface 65 is a part of the lower face of the nozzle main body 62 and in the embodiment, is formed at the same position as the suction surface 63 in the θ-axis direction. The auxiliary surface 65 is formed in various shapes according to the shape of the upper face of the LED element 80 and appropriately sets a position in the θ-axis direction with respect to the suction surface 63.

As described above, in the LED element 80 which is sucked by the dedicated nozzle 60 having an anisotropic lower face shape, the suction angle of the dedicated nozzle 60 whose positioning of an angle is determined when holding the LED element 80 is set to be limited to a predetermined angle range with respect to a reference (for example, the center of the outer shape, a characteristic section of the upper face, or the like) of the LED element 80. In a suction process regarding the LED element 80 as the object, the control device 70 performs positioning and positioning of the angle of the dedicated nozzle 60 according to the suction position and the suction angle which are set, and the suction surface 63 and the auxiliary surface 65 approach and suck the LED element 80 to be in contact with the upper face of the LED element 80.

(2-3. Holding of LED Element 80 by Dedicated Nozzle 60)

In a state where the dedicated nozzle 60 having the configuration described-above sucks and holds the LED element 80, the suction surface 63 and the auxiliary surface 65 are in contact with the upper face of the LED element 80 at positions indicated by two-dotted chain lines of FIG. 5. Specifically, an end portion of each of the multiple the electrode sections 83 in the LED element 80 is positioned inside the opening section 63a of the suction surface 63. The suction surface 63 is in contact with the upper face of the component main body 81 which is the outer periphery side of the multiple the electrode sections 83 and is not in contact with the multiple the light emitting sections 82.

In this case, since the retraction section 64 of the dedicated nozzle 60 is positioned closer to the cylindrical section 61 side than the suction surface 63 and the auxiliary surface 65, a non-contact state is maintained with respect to any of the multiple the light emitting sections 82. Specifically, in a case where the LED element 80 is inclined about a contact point between the suction surface 63 and the component main body 81 as a fulcrum, the auxiliary surface 65 is subsidiary in contact with the upper face of the component main body 81 on a side opposite to the multiple the electrode sections 83 with respect to the multiple the light emitting sections 82. Therefore, the inclination of the LED element 80 is suppressed and the contact of the lower face of the nozzle main body 62 with the multiple the light emitting sections 82 is prevented.

As described above, a mode, in which the dedicated nozzle 60 is used when the LED element 80 whose withstand load is relatively low in the vicinity of the center of the outer shape is sucked and held, is exemplified. On the other hand, the dedicated nozzle 60 is particularly useful to apply a case where it is a component type whose centroid position is at a position away from the vicinity of the center of the outer shape or a portion which is low in the withstand load, or unevenness is in the vicinity of the center of the outer shape so that the LED element 80 cannot be in contact with the suction nozzle 46.

3. Mounting Control by Component Mounting Machine 1

The mounting control of the electronic component T1 by the component mounting machine 1 will be described with reference to FIG. 7. In the mounting control, first, the mounting control section 71 causes the electronic components T1 to be sequentially sucked to multiple the suction nozzles 46 and executes a suction cycle (step 10 (hereinafter, "step" is referred to as "S")) for holding the electronic component T1.

More specifically, in the suction cycle (S10) of the embodiment, first, the mounting control section 71 determines whether or not the electronic component T1 to be sucked is an object of a TVR control (S11). Here, the "TVR control" is a control for correcting the posture of the electronic component T1 based on the characteristic section that is in the upper face of the electronic component T1 when the electronic component T1 is mounted on the circuit board Bd. For example, in a case where it is necessary to mount the LED element 80 along a reference line on the circuit board Bd in the linear direction in which the multiple the light emitting sections 82 are arranged in the LED element 80, the multiple the light emitting sections 82 is the "characteristic section that is on the upper face of the electronic component T1" and the LED element 80 is set as the object of the TVR control.

Therefore, in a case where the electronic component T1 scheduled to be sucked is the object of the TVR control (S11: Yes), in order to acquire the image data including the upper face of the electronic component T1, the mounting control section 71 executes an imaging process of the upper face of the electronic component T1 (S12). Specifically, in a state where the board camera 16 provided on the moving table 32 of the component transfer device 30 is moved upward the tray 25 and the electronic component T1 scheduled to be sucked is kept in the visual field of the camera of the board camera 16, the imaging process of the board camera 16 is executed.

Next, the mounting control section 71 performs processing of recognizing the characteristic section of the upper face of the electronic component T1 based on the image data acquired by the imaging process (S12) of the upper face (S13). Therefore, the mounting control section 71 recognizes the posture of the electronic component T1 stored in the pocket 25b of the tray 25, the position and the angle of the characteristic section of the upper face of the electronic component T1. The mounting control section 71 indexes the suction position and the suction angle of the electronic component T1 based on a result of recognition.

The mounting control section 71 acquires the suction position of the electronic component T1 as the processing position (XY-axis position) of the dedicated nozzle 60 when the dedicated nozzle 60 sucks the electronic component T1. In addition, the mounting control section 71 acquires the suction angle of the electronic component T1 as the processing angle (θ-axis angle) of the dedicated nozzle 60 when the dedicated nozzle 60 sucks the electronic component T1.

Subsequently, the mounting control section 71 executes the suction process of the electronic component T1 (S14). In a case where the electronic component T1 scheduled to be sucked is the object of the TVR control (S11: Yes), the mounting control section 71 causes the dedicated nozzle 60 to move to the acquired processing position and causes the dedicated nozzle 60 to rotate at the acquired processing angle. In this state, the mounting control section 71 lowers the dedicated nozzle 60 while supplying the negative pressure air to the dedicated nozzle 60 and causes the electronic component T1 to be sucked.

On the other hand, in a case where the electronic component T1 scheduled to be sucked is not the object of the TVR control (S11: No), the mounting control section 71 corrects the posture of the electronic component T1 based on the outer shape or the characteristic section that is on the lower face of the electronic component T1 when the electronic component T1 is mounted on the circuit board Bd in a mounting process (S30) which is described later. Therefore, in a case of the electronic component T1 that is not the object of the TVR control, the imaging process (S12) of the upper face or the like is omitted.

The mounting control section 71 moves the suction nozzle 46 to the supply position Ps at which the electronic component T1 is supplied and the suction position set in the electronic component T1 in the suction process (S14) of the electronic component T1. The mounting control section 71 lowers the suction nozzle 46 while supplying the negative pressure air to the suction nozzle 46 and causes the electronic component T1 to be sucked.

The mounting control section 71 determines whether or not the suction process of all the electronic components T1 scheduled to be sucked is completed in a current mounting cycle based on a control program (S15). The mounting control section 71 repeatedly executes the processing (S11 to S14) until all the suction process are completed and the suction cycle is completed. Thereafter, the control device 70 causes the mounting head 40 to move above the component camera 15 by an operation of the component transfer device 30 and executes the imaging process for imaging the lower faces of multiple the sucked electronic components T1 (S20).

The mounting control section 71 executes the mounting process (S30) for sequentially mounting the multiple the electronic components T1 on the circuit board Bd based on the control program and the control information. The mounting control section 71 determines whether or not the mounting process of all the electronic components T1 is completed (S40). Details of the mounting process by the mounting control section 71 will be described later. The mounting control section 71 repeatedly executes the processing (S10 to S30) until the mounting process is completed.

In addition, in the mounting control by the component mounting machine 1, in order to improve accuracy, the mounting control section 71 controls the movement of the suction nozzle 46 corresponding to a suction state of the electronic component T1 by the suction nozzle 46. Therefore, the mounting control section 71 performs the image processing of the image data acquired by the imaging process (S30) of the lower face of the electronic component T1 in the image processing section 72 and recognizes the suction state of the electronic component T1 by the suction nozzle 46.

Here, the above-described "mounting cycle" is an operation from holding the multiple the electronic components T1 supplied by the component transfer device 30 until the number of mounting operations equivalent to the number of the held electronic components T1 is repeatedly completed, that is, the operation of the component transfer device 30 for executing the processing (S10 to S30). In a case where the mounting head 40 supports twelve suction nozzles 46, an operation from suction of the twelve electronic components T1 of the maximum to completing the mounting of all the electronic components T1 corresponds to one mounting cycle.

In addition, the mounting control section 71 is capable of performing the suction process (S14) of a high-accuracy mode and the imaging process (S20) of the lower face similar to the mounting process (S30) of a high-accuracy mode which is described later in the suction process (S14) and the imaging process (S20) of the lower face. The suction process (S14) of the high-accuracy mode and the imaging process (S20) of the lower face will be described later.

Moreover, in the mounting process (S30) and calibration processing which are described later, the suction nozzle 46 indicates one suction nozzle 46 which is indexed to the lifting and lowering position among the multiple the suction nozzles 46 supported by the mounting head 40. That is, except for a case where a pivoting motion around the R-axis is mentioned in particular, one of the suction nozzles 46 is in the lifting and lowering position in one mounting cycle and the operation of the movement and the rotation of the suction nozzle 46 is explained.

4. Mounting Process and Calibration Processing (4-1. Outline of Mounting Process)

In the mounting process (S30) by the mounting control section 71 of the control device 70, the suction nozzle 46, which holds the electronic component T1, is moved from the current position to a predetermined mounting position (corresponding to "the processing position") on the circuit board Bd, the suction nozzle 46 is rotated from the current angle to a predetermined mounting angle (corresponding to "the processing angle"), and then the suction nozzle 46 is lowered to mount the electronic component T1 on the circuit board Bd. Such an operation of the component transfer device 30 is repeated by the number of the electronic components T1 held by the suction cycle (S10).

Moreover, during a period in which the mounting head 40 supporting the multiple the suction nozzles 46 is moved upward the mounting position from the current position, the component transfer device 30 mainly performs positioning in the XY-axis direction, indexing of the suction nozzle 46, and positioning of the rotation angle of the suction nozzle 46. The positioning the XY-axis direction is an operation by the head driving device 31 which positions the mounting head 40 at the next mounting position. The mounting position includes a correction amount according to the suction state.

In addition, indexing of the suction nozzle 46 is an operation of causing the suction nozzle 46 to revolve around the R-axis by a R-axis driving device including the R-axis motor 42 and is an operation of indexing the suction nozzle 46, which holds the electronic component T1 corresponding to the next mounting position, among the multiple the suction nozzles 46 to the lifting and lowering position. Therefore, the suction nozzle 46 which is lifted and lowered in the next mounting is rotated around the R-axis and is positioned at the lifting and lowering position.

In addition, the positioning of the rotation angle of the suction nozzle 46 is an operation of rotating the suction nozzle 46 by a θ-axis driving device including the θ-axis motor 51 and is an operation of rotating the suction nozzle 46 around the θ-axis to the next mounting angle. The mounting angle includes the angle of the electronic component T1 with respect to the circuit board Bd instructed by the control program and the correction amount according to the suction state of the electronic component T1.

(4-2. Calibration Processing)

The operation of the component transfer device 30 is affected by backlash or the lost motion in the head driving device 31, the θ-axis driving device, or the like. Therefore, the control device 70 performs calibration by using a calibration value corresponding to each driving device, which is acquired by the calibration processing executed in advance in addition to the correction based on the suction state of the electronic component T1 by the suction nozzle 46 with respect to the operation of the component transfer device 30.

In the calibration processing, as illustrated in FIG. 8, for example, in a state where a calibration jig 90 is positioned and fixed to the board conveyance device 10, a dummy component T2 for the calibration processing is mounted on predetermined mounting positions fPm1 to fPm3 on the calibration jig 90 at predetermined mounting angles fAm1 to fAm3. In this case, the operation of the component transfer device 30 is controlled by the control program for calibration.

Moreover, in the embodiment, the calibration processing adopts a method passing through predetermined preparation positions fPr1 to fPr3 before mounting the dummy components T2 on the predetermined mounting positions fPm1 to fPm3 respectively corresponding to the mounting process of the high-accuracy mode which is described later. In the embodiment, the preparation positions fPr1 to fPr3 are respectively set at positions displaced by a defined distances LPx and LPy in the propelling axis (XY-axis) direction with respect to the mounting positions fPm1 to fPm3.

When the suction nozzle 46 is moved to the preparation positions fPr1 to fPr3, the mounting control section 71 temporarily stops the operation of the XY-axis of the head driving device 31 and temporarily stops the moving of the suction nozzle 46 in the propelling direction (XY-axis direction). Furthermore, the mounting control section 71 causes preparation angles fAr1 to fAr3 around the θ-axis of the suction nozzle 46 in the preparation positions fPr1 to fPr3 to pivot by a defined angle APθ of the rotation axis (the θ-axis) in the circumferential direction with respect to the mounting angles fAm1 to fAm3 of the suction nozzle 46 when the dummy component T2 is mounted on the mounting positions fPm1 to fPm3.

When the suction nozzle 46 is rotated to the preparation angles fAr1 to fAr3, the mounting control section 71 temporarily stops the operation of the θ-axis of the θ-axis driving device so that the rotation of the suction nozzle 46 in the rotational direction (θ-axis direction) is temporarily stopped. As described above, the suction nozzle 46 is positioned at preparation positions Pr1 to Pr3 and is positioned at the preparation angles Ar1 to Ar3, to be in the preparation state before moving and rotating to the mounting positions fPm1 to fPm3.

Thereafter, the mounting control section 71 rotates the suction nozzle 46 in the defined rotational direction (circumferential direction of the θ-axis) and angle APθ while moving the suction nozzle 46 the defined direction (axial direction of the XY-axis) and the distances LPx and LPy. Therefore, the suction nozzles 46 are respectively transferred from the preparation state to the mounting state corresponding to the mounting positions fPm1 to fPm3 and the mounting angles fAm1 to fAm3.

Here, a large number of calibration marks are attached to an upper face of the calibration jig 90 in a matrix at defined intervals. The control device 70 images the calibration mark and the mounted dummy component T2 by the board camera 16 and subjects the image data acquired by the imaging to image processing by the image processing section 72 to acquire the calibration value of the component transfer device 30.

Specifically, the image processing section 72 recognizes the outer shape of the dummy component T2 and calculates a relative position and a relative angle between the calibration mark and the dummy components T2 which is mounted on the mounting positions fPm1 to fPm3 corresponding to the calibration mark. The control device 70 acquires a calibration value with respect to the axial direction and the distance of the propelling axis (XY-axis) by the head driving device 31 and a calibration value with respect to the circumferential direction and the angle of the rotation axis (θ-axis) by the θ-axis driving device based on the calculated relative position and the relative angle.

(4-3. Details of Mounting Process)

As illustrated in FIG. 9, the control device 70 determines whether to perform the mounting process (S30) of the electronic component T1 corresponding to the next mounting position in the normal mode or the high-accuracy mode based on the control information (S31). Here, the mounting process (S30) of the normal mode is processing that does not require the passage of the preparation state when the suction nozzle 46 is transferred from the current state to the mounting state. On the other hand, the mounting process (S30) of the high-accuracy mode is processing that requires passage of the preparation state when the suction nozzle 46 is transferred from the current state to the mounting state.

Here, "the state" of the suction nozzle 46 includes the position in the propelling axis (XY-axis) direction and the angle of the rotation axis (θ-axis) in the circumferential direction. That is, "the current state" of the suction nozzle 46 is a state of the suction nozzle 46 at the current time. Similarly, "the mounting state" of the suction nozzle 46 is a state of the suction nozzle 46 which mounts the electronic components T1 at the mounting positions fPm1 to fPm3. In addition, "the preparation state" of the suction nozzle 46 is a state of the suction nozzle 46 which is moved to the preparation positions Pr1 to Pr3 which are set with respect to multiple the mounting positions Pm1 to Pm3 and rotated to the preparation angles Ar1 to Ar3.

In addition, the preparation positions Pr1 to Pr3 are original positions that become the mounting position Pm1 in a case where the suction nozzle 46 is moved in the defined propelling direction (axial direction of the XY-axis in the embodiment) and at the distances LPx and LPy. In addition, the preparation angle Ar1 is an original angle that becomes the mounting angle Am1 in a case where the suction nozzle 46 is rotated in the defined rotational direction (circumferential direction of the θ-axis in the embodiment) and angle LAθ.

The control information stored in the storage device 73 is information indicating whether it is the high-accuracy mode in which the suction nozzle 46 passes through the preparation position Pr1 or the normal mode in which the suction nozzle 46 is not required to pass through the preparation position Pr1 in a case where the suction nozzle 46 is moved from the current position Pc to the nest mounting position Pm1. In addition, the control information is information indicating whether it is the high-accuracy mode in which the suction nozzle 46 passes through the preparation angle Ar1 or the normal mode in which the suction nozzle 46 is not required to pass through the preparation angle Ar1 in a case where the suction nozzle 46 is rotated from the current angle Ac to the nest mounting angle Am1.

The control information may set whether or not it is the high-accuracy mode, for example, for each electronic component T1, for each electronic component, for each component type, for one mounting cycle. In the embodiment, an aspect in which the high-accuracy mode or the normal mode is switched for one mounting cycle is exemplified. In addition, in the control information, it is possible to set only one of the propelling axis ((XY-axis) and the rotation axis (θ-axis) to the high-accuracy mode.

(4-3-1. Mounting Process of Normal Mode)

In a case where the mounting process (S30) is executed in the normal mode (S31: Yes), the suction nozzle 46 is moved in the order indicated by arrows of two-dotted chain lines of FIG. 10. Specifically, in a case where the suction nozzle 46 is moved from the current position Pc to the next mounting position Pm1, first, the mounting control section 71 calculates the mounting position Pm1 and the mounting angle Am1 for the normal mode (S32). The mounting position Pm1 for the normal mode is a position in which the calibration value relating to the operation of the head driving device 31 acquired by the calibration processing is adjusted by using a coefficient according to the distance between the current position Pc and the next mounting process Pm1, and an instructed position in the control program is calibrated based on the adjusted calibration value, and which is further corrected according to the suction state.

In addition, the mounting angle Am1 for the normal mode is an angle in which the calibration value relating to the operation of the θ-axis driving device acquired by the calibration processing is adjusted by using a coefficient according to an angle difference between the current angle Ac and the next mounting angle Am1, and a command angle in the control program is calibrated based on the adjusted calibration value, and which is further corrected according to the suction state. The mounting control section 71 causes the suction nozzle 46 to move from the current position Pc to the next mounting position Pm1 and causes the suction nozzle 46 to rotate from the current angle Ac to the next mounting angle Am1 (S33).

Thereafter, the mounting control section 71 lowers the suction nozzle 46 to mount the electronic component T1 on the circuit board Bd and lift the suction nozzle 46 (S34). The mounting control section 71 determines whether or not the mounting process of all the electronic components T1 scheduled to be mounted in the current mounting cycle is completed based on the control program (S35). The mounting control section 71 repeatedly executes the processing (S32 to S34) until all the mounting processes are completed with the current suction nozzle 46 as the current state, and the mounting process (S30) is completed.

As described above, in order to cope with backlash and lost motion uniquely generated by the component mounting machine 1, the control device 70 uses the calibration value acquired by the calibration processing to reduce a positioning error and a positioning error of angle in the mounting positions Pm1 to Pm3 for the normal mode. Therefore, the moving operation and the rotation operation of the suction nozzle 46 in the mounting positions Pm1 to Pm3 for the normal mode are controlled so as to be kept within a certain allowable error range.

(4-3-2. Mounting Process of High-Accuracy Mode)

In the mounting process (S30) of the normal mode, the position of the suction nozzle 46 in the propelling axis (XY-axis) direction, the angle around the rotation axis (θ-axis) are kept within the allowable error range, and variation occurs within the range. Therefore, the control device 70 executes the mounting process (S30) of the high-accuracy mode for reducing the variation in a case where more accurate mounting process (S30) is required.

In a case where the mounting process (S30) is executed in the high-accuracy mode (S31: No), the suction nozzle 46 is moved in the order indicated by arrows of thick solid lines of FIG. 10. Specifically, in a case where the suction nozzle 46 is moved from the current position Pc to the next mounting position Pm1, the mounting control section 71 of the control device 70 transfers the suction nozzle 46 to the preparation state and then transfers the suction nozzle 46 from the preparation state to the mounting state.

Here, as described above, the component mounting machine 1 performs the calibration processing in advance for acquiring the calibration value for the axial direction and the distance of the propelling axis regarding the propelling axis (XY-axis) as the object which is moved when the suction nozzle 46 is moved from the preparation state to the mounting state. In the embodiment, the defined propelling direction and distances LPx and LPy are set to be the same as the axial direction of the propelling axis (XY-axis) and the distances LPx and LPy by which the suction nozzles 46 are moved from the preparation positions fPr1 to fPr3 to the mounting positions fPm1 to fPm3 respectively in the calibration processing.

In addition, in the embodiment, the rotation axis (θ-axis) is included in the object of the mounting process (S30) of the high-accuracy mode. Therefore, in the preparation state, the mounting control section 71 rotates the suction nozzle 46 in the defined rotational direction (the circumferential direction of the θ-axis) and angle with respect to the mounting angle. Specifically, in a case where the suction nozzle 46 is moved from the current position Pc to the next mounting process Pm1, the mounting control section 71 rotates the suction nozzle 46 to the preparation angle Ar1 by rotating in the defined rotational direction (circumferential direction of the θ-axis) and angle APθ with respect to the mounting angle Am1 of the suction nozzle 46 on which the electronic component T1 is mounted in the mounting position Pm1.

Here, as described above, the component mounting machine 1 performs the calibration processing in advance for acquiring the calibration value for the circumferential direction and the angle of the rotation axis regarding the rotation axis (θ-axis) as the object which is rotated when the suction nozzle 46 is moved from the preparation state to the mounting state. In the embodiment, the defined rotational direction and angle APθ are set to be the same as the circumferential direction and the angle APθ of the rotation axis (θ-axis) in which the suction nozzles 46 are rotated from the preparation angles fAr1 to fAr3 to the mounting angles fAm1 to fAm3 respectively in the calibration processing.

As described above, the preparation state of the suction nozzle 46 is a state where the suction nozzle 46 is displaced in defined the propelling direction (XY-axis direction) and the distance with respect to the mounting state, and is a state where the suction nozzle 46 is pivoted in the defined rotational direction (circumferential direction of the θ-axis) and angle with respect to the mounting state.

In the mounting process of the high-accuracy mode, the mounting control section 71 first calculates the mounting position Pm1 and the mounting angle Am1 for the high-accuracy mode (S41). Assuming that the mounting position Pm1 for the high-accuracy mode moves from the preparation position Pr1 to the instructed position by the control program, the mounting position Pm1 for the high-accuracy mode is a position in which the instructed position is calibrated based on the calibration value adjusted by using the coefficient according to the distance of the movement and which is further corrected according to the suction state. Moreover, in the embodiment, since the defined distances LPx and LPy are set to be the same as the distances LPx and LPy by which the suction nozzle 46 is moved in the calibration processing, the coefficient is set to 1 and adjustment of the calibration value by using the coefficient is omitted.

In addition, assuming that the mounting angle Am1 for the high-accuracy mode rotates from the preparation angle Ar1 to the command angle by the control program, the mounting angle Am1 for the high-accuracy mode is an angle in which the command angle is calibrated based on the calibration value adjusted by using the coefficient according to the angle of the rotation and which is further corrected according to the suction state. Moreover, in the embodiment, since the defined angle APθ is set to be the same as the angle APθ by which the suction nozzle 46 is pivoted in the calibration processing, the coefficient is set to 1 and adjustment of the calibration value by using the coefficient is omitted.

Next, the mounting control section 71 calculates the preparation position Pr1 and the preparation angle Ar1 (S42). The preparation position Pr1 is a position which is moved to the defined propelling direction and distances LPx and LPy with respect to the mounting position Pm1 after calibration calculated in S41, and includes a correction amount according to the suction state. The preparation angle Ar1 is an angle which is rotated in the defined rotational direction and angle APθ with respect to the mounting angle Am1 after correction calculated in S41, and includes a correction amount according to the suction state.

The mounting control section 71 causes the suction nozzle 46, which is in the current position Pc and the current angle Ac, to move to the preparation position Pr1 and causes the suction nozzle 46 to rotate to the preparation angle Ar1 (S43). Therefore, the suction nozzle 46 is transferred to the preparation state according to the next mounting state. The control device 70 temporarily stops the operation of the driving device which is driven when the suction nozzle 46 is transferred from the preparation state to the mounting state in the preparation state of the suction nozzle 46 (S44).

Specifically, the mounting control section 71 of the control device 70 temporarily stops the operation of the head driving device 31 regarding the XY-axis when the suction nozzle 46 reaches the preparation position Pr1. Therefore, a speed of the suction nozzle 46 in the X-axis direction and in the Y-axis direction is temporarily 0. Similarly, the mounting control section 71 of the control device 70 temporarily stops the operation of the θ-axis driving device regarding the θ-axis when the suction nozzle 46 reaches the preparation angle Ar1. Therefore, a pivoting speed of the suction nozzle 46 around the θ-axis is temporarily 0.

The mounting control section 71 causes the suction nozzle 46 to move from the preparation position Pr1 to the next mounting position Pm1 and causes the suction nozzle 46 to rotate from the preparation angle Ar1 to the next mounting angle Am1 (S45). Thereafter, the mounting control section 71 lowers the suction nozzle 46, mounts the electronic component T1 on the circuit board Bd, and lifts the suction nozzle 46 (S46). The mounting control section 71 determines whether or not the mounting process of all the electronic components T1 scheduled to be mounted in the current mounting cycle based on the control program (S47). The mounting control section 71 repeatedly executes the processing (S41 to S46) until all the mounting process are completed with the current suction nozzle 46 as the current state, and the mounting process (S30) is completed.

As described above, the control device 70 controls the moving operation of the suction nozzle 46 by switching the high-accuracy mode and the normal mode based on the control information when the suction nozzle 46 is sequentially moved to the multiple the mounting positions Pm1 to Pm3 and when the suction nozzle 46 is sequentially rotated to the multiple the mounting angles Am1 to Am3 in the mounting process (S30). Therefore, in a case where the mounting process (S30) is executed in the high-accuracy mode (S31: No), the suction nozzle 46 is moved and rotated in the order indicated by arrows of thick solid lines of FIG. 10.

In this case, in the mounting process (S30) of the high-accuracy mode, an immediately before operation of the suction nozzle 46 according to the movement to each of the mounting positions Pm1 to Pm3 is in the defined axial direction (XY-axis direction) and the distances LPx and LPy, and is common. Therefore, the variation of the position of the suction nozzle 46 in the XY-axis direction is reduced compared to the normal mode in which the suction nozzle 46 is sequentially and directly moved from the current position Pc to the mounting positions Pm1 to Pm3, so that highly accurate positioning can be performed.

In addition, in the mounting process (S30) of the high-accuracy mode, an immediately before operation of the suction nozzle 46 according to the rotation to each of the mounting angles Am1 to Am3 is in the defined rotational direction (circumferential direction of the θ-axis) and angle APθ and is common. Therefore, the variation of the position of the suction nozzle 46 around the θ-axis is reduced compared to the normal mode in which the suction nozzle 46 is sequentially and directly rotated from the angle around the θ-axis in the current position Pc to the mounting angles Am1 to Am3, so that highly accurate positioning of the angle can be performed.

5. Optimization of Control Program

In the mounting control, the control device 70 of the component mounting machine 1 controls the moving operation and the rotation operation of the suction nozzle 46 according to the control program indicating the order of transferring the electronic component T1 to the multiple the mounting positions Pm1 to Pm3. In addition, the control device 70 determines whether or not the mounting process of the electronic component T1 with respect to the mounting positions Pm1 to Pm3 indicated by the control program is performed in the high-accuracy mode (S31). Therefore, before the suction nozzle 46 is transferred to the mounting state, it is determined whether or not the suction nozzle 46 passes through the preparation state.

That is, the control device 70 inserts the movement to the preparation positions Pr1 to Pr3 before the suction nozzle 46 is transferred to the mounting state in a case where the high-accuracy mode is set in the control information. Therefore, a movement path of the suction nozzle 46 is different between the normal mode indicated by the arrows of the two-dotted chain lines of FIG. 10 and the high-accuracy mode indicated by the arrows of the thick solid lines of FIG. 10.

Therefore, in the embodiment, the control program used for the mounting control is optimized in the order of transferring the electronic components T1 based on the movement amount or the movement time of the suction nozzle 46 according to the movement of the suction nozzle 46 to the multiple the mounting positions Pm1 to Pm3. More specifically, in the optimization process, the movement amount or the movement time in the multiple the order patterns, in which the order of the multiple moving groups is replaced by one moving group in the movement from the common preparation position to the mounting position, are calculated. The control program is optimized by adopting an order pattern having a small movement amount or a short movement time as an optimum transfer order.

6. Effects of Configuration of Embodiment

The control device 70 (control method) according to the embodiment is applied to the component mounting machine 1, which transfers the electronic component T1 to the mounting positions Pm1 to Pm3 on the circuit board Bd by holding the electronic component T1 supplied to the supply position Ps by the holding member (suction nozzle 46), and controls the moving operation of the holding member (suction nozzle 46). In a case where the holding member (suction nozzle 46) is moved from the current position Pc to the predetermined processing positions (mounting positions Pm1 to Pm3) within the component mounting machine 1, the control device 70 moves the holding member (suction nozzle 46) to the preparation positions Pr1 to Pr3 which are set in the defined propelling direction and distances LPx and LPy with respect to the processing positions (mounting positions Pm1 to Pm3), and then moves the holding member (suction nozzle 46) from the preparation positions Pr1 to Pr3 to the processing positions (mounting positions Pm1 to Pm3).

According to the configuration, the suction nozzle 46 passes through the preparation positions Pr1 to Pr3 when the suction nozzle 46 sequentially moves from the current position Pc to the mounting positions Pm1 to Pm3. Therefore, the movement amount of the suction nozzle 46 when moving from the preparation positions Pr1 to Pr3 to the mounting positions Pm1 to Pm3 is a fixed amount according to the defined distances LPx and LPy. Therefore, the position error occurred due to the backlash or the like in the mounting positions Pm1 to Pm3 after the movement is reduced. Therefore, it is possible to improve accuracy of mounting control by mounting control using a calibration value for calibrating the position error.

In addition, regarding the propelling axis (XY-axis) as the object which is displaced when the holding member (suction nozzle 46) moves from the preparation positions Pr1 to Pr3 to the processing positions (mounting positions Pm1 to Pm3), the component mounting machine 1 executes in advance the calibration processing for acquiring the calibration value with respect to the axial direction of the propelling axis (XY-axis) and the distances LPx and LPy. The defined propelling direction and distances LPx and LPy are set in the axial direction of the propelling axis (XY-axis) and the distance LPx and LPy by which the holding member (suction nozzle 46) is moved in the calibration processing.

According to the configuration, the defined propelling direction and distances LPx and LPy are set to be the same as the axial direction of the propelling axis (XY-axis) and the distances LPx and LPy in the calibration processing. Here, in a case where the movement distance in the propelling direction and distances LPx and LPy are different in the calibration processing, it is necessary to adjust the calibration value by using a coefficient based on the difference. On the other hand, according to the above-described configuration, since the coefficient is 1, the adjustment of the calibration value can be omitted. In addition, the calibration value acquired by the calibration processing can be accurately reflected to the movement of the suction nozzle 46 which is transferred from the preparation state to the mounting state.

In addition, the preparation positions Pr1 to Pr3 are set in the defined propelling direction and distances LPx and LPy with respect to the processing positions (mounting positions Pm1 to Pm3) which are calibrated by using the calibration value. According to the configuration, the suction nozzle 46 passes through the preparation positions Pr1 to Pr3 which are displaced from the mounting positions Pm1 to Pm3 calibrated based on the calibration value which is acquired by the calibration processing to the defined distances LPx and LPy in the propelling direction. Therefore, when the suction nozzle 46 moves from the preparation positions Pr1 to Pr3 to the mounting positions Pm1 to Pm3, the calibration value acquired by the calibration processing can be used without being adjusted. Therefore, it is possible to improve accuracy of control processing.

In addition, when the holding member (suction nozzle 46) is moved to the preparation positions Pr1 to Pr3, the control device 70 temporarily stops the movement of the holding member (suction nozzle 46) in the propelling direction (S44). According to the configuration, when the suction nozzle 46 is moved from the current position Pc to the preparation positions Pr1 to Pr3, the operation of the head driving device 31 regarding the propelling axis (XY-axis) is temporarily stopped. Therefore, the suction nozzle 46 causes the speed of the propelling axis (XY-axis) in the axial direction which is the object of control in the high-accuracy mode, to be temporarily 0. Therefore, the movement amount in the movement of the suction nozzle 46 from the preparation positions Pr1 to Pr3 to the mounting positions Pm1 to Pm3 can be further reliably in a fixed amount regardless of the current position Pc of the suction nozzle 46. Therefore, since the position error of the suction nozzle 46 after the movement is reduced, it is possible to improve accuracy of the mounting control.

In addition, in a case where the holding member (suction nozzle 46) is moved from the current position Pc to the processing positions (mounting positions Pm1 to Pm3), the control device 70 has control information indicating whether it is the high-accuracy mode in which the suction nozzle 46 passes through the preparation positions Pr1 to Pr3 or the normal mode in which the suction nozzle 46 does not pass through the preparation positions Pr1 to Pr3. When the holding member (suction nozzle 46) is sequentially moved to the multiple processing positions (mounting positions Pm1 to Pm3), the control device 70 controls the moving operation of the holding member (suction nozzle 46) by switching the high-accuracy mode and the normal mode based on the control information.

According to the configuration, the mounting process can be executed according to accuracy required in the mounting process. Since the mounting process (S30) of the high-accuracy mode passes through the preparation positions Pr1 to Pr3, the entire movement distance and the movement time is increased compared to those of the mounting process (S30) of the normal mode. Therefore, in a case where accuracy in the normal mode is sufficient, the mounting process (S30) is executed in the normal mode and in a case where further high accuracy is required, the mounting process (S30) of the high-accuracy mode is executed according to, for example, the component type or the like. Therefore, it is possible to suppress an increase in the mounting time required for the entire control while ensuring required accuracy.

The control device 70 (control method) according to the embodiment is applied to the component mounting machine 1, which transfers the electronic component T1 to the mounting positions Pm1 to Pm3 on the circuit board Bd by holding the electronic component T1 supplied to the supply position Ps by the holding member (suction nozzle 46), and controls the rotation operation of the holding member (suction nozzle 46). In a case where the holding member (suction nozzle 46) is rotated from the current angle Ac to the predetermined processing angle (mounting angles Am1 to Am3), the control device 70 causes the holding member (suction nozzle 46) to move to the defined rotational direction and preparation angles Ar1 to Ar3 which are set at the angle APθ with respect to the processing angle (mounting angles Am1 to Am3), and then causes the holding member (suction nozzle 46) to rotate from the preparation angles Ar1 to Ar3 to the processing angles (mounting angles Am1 to Am3).

According to the configuration, the suction nozzle 46 passes through the preparation angles Ar1 to Ar3 when rotating from the current angle Ac to the mounting angles Am1 to Am3. Therefore, the rotation of the suction nozzle 46 from the preparation angles Ar1 to Ar3 to the mounting angles Am1 to Am3 is in a fixed amount in accordance with the angle APθ of the defined rotational direction. Therefore, the angle error generated by backlash or the like at the mounting angles Am1 to Am3 of the suction nozzle 46 after the rotation is reduced. Therefore, it is possible to improve accuracy of mounting control by mounting control using the calibration value for calibrating the angle error.

In addition, the component mounting machine 1 performs the calibration processing in advance for acquiring the calibration value for the circumferential direction and the angle of the rotation axis (θ-axis) regarding the rotation axis (θ-axis) as the object which is pivoted when the holding member (suction nozzle 46) is rotated from the preparation angles (Ar1 to Ar3) to the processing angles (mounting angles Am1 to Am3). The defined rotational direction and angle APθ are set to be the circumferential direction and the angle APθ of the rotation axis (θ-axis) rotating the holding member (suction nozzle 46) in the calibration processing.

According to the configuration, the defined rotational direction and angle APθ are set to be the same as the circumferential direction and the angle APθ of the rotation axis (θ-axis) in the calibration processing. Here, in a case where the rotation angle in the rotational direction and the defined angle APθ are different in the calibration processing, it is necessary to adjust the calibration value by using the coefficient based on the difference. On the other hand, according to the above-described configuration, since the coefficient is 1, the adjustment of the calibration value can be omitted. In addition, the calibration value acquired by the calibration processing can be accurately reflected to the movement of the suction nozzle 46 which is transferred from the preparation state to the mounting state.

In addition, the preparation angles Ar1 to Ar3 are set in the defined rotational direction and angle APθ with respect to the processing angles (mounting angles Am1 to Am3) which are calibrated by using the calibration value. According to the configuration, the suction nozzle 46 passes through the preparation angles Ar1 to Ar3 which are pivoted from the mounting angles Am1 to Am3 calibrated based on the calibration value which is acquired by the calibration processing, to the defined angle APθ in the rotational direction. Therefore, when the suction nozzle 46 rotates from the preparation angles Ar1 to Ar3 to the mounting angles Am1 to Am3, the calibration value acquired by the calibration processing can be used without being adjusted. Therefore, it is possible to improve accuracy of control processing.

In addition, when the holding member (suction nozzle 46) is rotated to the preparation angles Ar1 to Ar3, the control device 70 temporarily stops the rotation of the holding member (suction nozzle 46) in the rotational direction (S44). According to the configuration, when the suction nozzle 46 is rotated from the current angle Ac to the preparation angles Ar1 to Ar3, the operation of the θ-axis driving device regarding the rotation axis (θ-axis) is temporarily stopped. Therefore, the suction nozzle 46 causes the rotation speed of the rotation axis (θ-axis) which is the object of the high-accuracy mode to be temporarily 0. Therefore, the rotation amount in the rotation of the suction nozzle 46 from the preparation angles Ar1 to Ar3 to the mounting angles Am1 to Am3 can be further reliably in a fixed amount regardless of the current angle Ac of the suction nozzle 46. Therefore, since the rotation error of the suction nozzle 46 after the rotation is reduced, it is possible to improve accuracy of the mounting control.

In addition, in a case where the control device 70 causes the holding member (suction nozzle 46) to rotate from the current angle Ac to the processing angles (mounting angles Am1 to Am3), the control device 70 has control information indicating whether it is the high-accuracy mode in which the suction nozzle 46 passes through the preparation angles Ar1 to Ar3 or the normal mode in which the suction nozzle 46 is not required to pass through the preparation angles Ar1 to Ar3. When the holding member (suction nozzle 46) is sequentially rotated to the multiple processing angles (mounting angles Am1 to Am3), the control device 70 controls the rotation operation of the holding member (suction nozzle 46) by switching the high-accuracy mode and the normal mode based on the control information.

According to the configuration, the mounting process can be executed according to accuracy required in the mounting process. Since the mounting process (S30) of the high-accuracy mode passes through the preparation angles Ar1 to Ar3, there is a concern that the entire rotation amount and the rotation time is increased compared to those of the mounting process (S30) of the normal mode. Therefore, in a case where accuracy in the normal mode is sufficient, the mounting process (S30) is executed in the normal mode and in a case where further high accuracy is required, the mounting process (S30) of the high-accuracy mode is executed according to, for example, the component type or the like. Therefore, it is possible to suppress an increase in the mounting time required for the entire control while ensuring required accuracy.

In addition, the processing positions (mounting positions Pm1 to Pm3) include the mounting positions Pm1 to Pm3 on the circuit board Bd. The control device 70 controls the moving operation of the holding member (suction nozzle 46) according to the control program indicating the order of transferring the electronic component T1 to the multiple mounting positions Pm1 to Pm3. The control program is optimized in the order of transferring the electronic components T1 based on the movement amount or the movement time of the holding member (suction nozzle 46) according to the movement of the holding member (suction nozzle 46) to each of the preparation positions Pr1 to Pr3 corresponding to the multiple mounting positions Pm1 to Pm3.

Here, if the control program is optimized without considering passing through the preparation state, there is a concern that the cycle time is rather extended by passing through the preparation positions Pr1 to Pr3 by a relationship of the direction and distance between the continuous mounting positions Pm1 to Pm3, and the preparation positions Pr1 to Pr3. On the other hand, according to the above-described configuration, the control program is optimized assuming passing through the preparation state. Therefore, it is possible to prevent an increase in the cycle time and effectively perform the mounting control while improving accuracy of the mounting control.

Alternative Aspects of Embodiment (Mounting Process of High-Accuracy Mode)

In the embodiment, the control device 70 temporarily stops the operation of the head driving device 31 regarding the XY-axis and the operation of the θ-axis driving device regarding the θ-axis when the suction nozzle 46 is transferred to the preparation state. On the other hand, the control device 70 may limit the movement speed of the holding member (suction nozzle 46) in the propelling direction in a certain range when the holding member (suction nozzle 46) is moved to the preparation positions Pr1 to Pr3. Similarly, the control device 70 may limit the rotation speed of the holding member (suction nozzle 46) in the rotational direction in a certain range when the holding member (suction nozzle 46) is rotated to the preparation angles Ar1 to Ar3.

According to the configuration, the suction nozzle 46 is transferred to the preparation state and the operation of the driving device is limited so that the speed of the driving axis (propelling axis (XY-axis) or the rotation axis (θ-axis)) in the axial direction is set to a predetermined value. Therefore, the operation of the suction nozzle 46 can be further reliably in a fixed amount according to the transfer from the preparation state to the mounting state regardless of the current state. In addition, by maintaining the speed of the driving axis in the axial direction larger than 0, it is possible to suppress an increase in the cycle time due to passing through the preparation state compared to a configuration in which the operation of the suction nozzle 46 is temporarily stopped in the preparation state. However, from the viewpoint of further reducing the position error, the configuration exemplified in the embodiment is preferable.

In addition, in the embodiment, the control device 70 executes the mounting process of the high-accuracy mode in which an error of the driving device with respect to the driving axis is reduced regarding the X-axis and the Y-axis that are the propelling axis, and the θ-axis that is the rotation axis as the objects. On the other hand, the control device 70 may execute the mounting process of the high-accuracy mode regarding only one of the X-axis or the Y-axis as the propelling axis as the object and the R-axis or the θ-axis as the rotation axis as combined objects. Also in the configuration, the same effects as those of the embodiment can be obtained regarding the propelling axis or the rotation axis as the object.

In addition, in the embodiment, the defined distances LPx and LPy, and the defined angle APθ when the suction nozzle 46 is transferred from the preparation state to the mounting state are respectively set to the same as the distances LPx and LPy in the propelling direction (XY-axis direction), and the angle APθ in the rotational direction (circumferential direction of the θ-axis) in the calibration processing. On the other hand, the defined distances LPx and LPy, and the defined angle APθ may be set to values different from the distance and the angle of the operation in the calibration processing.

In this case, the calibration value is adjusted by using the coefficient (1 in the embodiment) according to the defined distances LPx and LPy, and the defined angle APθ and the mounting positions Pm1 to Pm3, and the mounting angles Am1 to Am3 are calibrated based on the adjusted calibration value. Such a configuration may be applied to, for example, a case where an interval between successive mounting positions with respect to the distance of the operation of the calibration processing is short, or a case where an angle difference of successive mounting angles with respect to the angle of the operation in the calibration processing is small.

However, from the viewpoint of omitting the adjustment of the calibration value acquired by the calibration processing and executing the mounting process without calculating the coefficient, the configuration exemplified in the embodiment is preferable. As described above, the result of the calibration processing is appropriately reflected and it is possible to improve accuracy of the mounting control by calibrating the mounting positions Pm1 to Pm3, and the mounting angles Am1 to Am3 based on the calibration value acquired by the calibration processing.

(Imaging Process of High-Accuracy Mode)

In the embodiment, the control device 70 applies the mounting positions Pm1 to Pm3 as "predetermined processing position within the component mounting machine", applies the mounting angles Am1 to Am3 as "processing angle of the holding member", and executes the mounting process (S30) in the high-accuracy mode. On the other hand, the control device 70 may apply the operation in the high-accuracy mode to the imaging process (S20) for imaging the lower face of the electronic component T1. In this case, the control device 70 applies the imaging position as "predetermined processing position within the component mounting machine" and the imaging angle as "processing angle of the holding member".

Here, the control device 70 first recognizes the fiducial mark 59 of the mounting head 40 in a case where the image data of the lower face of the normal mode acquired by the imaging process (S20) is subjected to image processing. The control device 70 recognizes the suction state of the electronic component T1 by the suction nozzle 46 based on the relative position with respect to the fiducial mark 59.

However, in a case of the mounting head to which the fiducial mark 59 is not attached, for example, imaging is performed by moving the head driving device 31 so that the R-axis matches the center of the visual field of the camera. In the image processing, the center of the image data is regarded as the R-axis and the suction state is recognized. Therefore, if an error is included in the positioning of the head driving device 31 in the XY-axis direction, the same error is also included in the suction state.

Therefore, the control device 70 causes the suction nozzle 46 to pass through the preparation state and to transfer to the imaging state, and imaging is performed by the component camera 15 in the imaging process (S20) of the lower face of the high-accuracy mode. Specifically, the control device 70 acquires the imaging position (corresponding to "processing position") of the mounting head 40 which is positioned in the imaging process (S20) of the lower face. In addition, the control device 70 acquires at least one of the imaging angle (corresponding to "processing angle") of the tool main body 44 which is angle-positioned around the R-axis in the imaging process (S20) of the lower face and the imaging angle (corresponding to "processing angle") of the suction nozzle 46 which is angle-positioned around the θ-axis.

The control device 70 sets the preparation position and the preparation angle corresponding to the acquired imaging position and the imaging angle. The control device 70 controls the moving operation of the component transfer device 30 so that the component transfer device 30 moves from the current position to the imaging position passing through the preparation position, and controls the rotation operation of the component mounting machine so that the component transfer device 30 rotates from the current angle to the imaging angle passing through the preparation angle. Thereafter, the control device 70 performs imaging by the component camera 15 positioned below the tool main body 44.

Therefore, in a case where the operation of the high-accuracy mode is applied to the imaging process (S20) of the lower face regarding the propelling axis (XY-axis) and the rotation axis (Rθ-axis) as the objects, errors of positioning of the suction nozzle 46 in the XY-axis direction and positioning of angle of the Rθ-axis in the circumferential direction are reduced. Therefore, even if the mounting head is not provided with the fiducial mark 59, it is possible to improve accuracy of the imaging process (S20) of the lower face regarding the electronic component T1 held by the suction nozzle 46 of the mounting head 40 as the object and accuracy of the recognition process of the suction state.

(Suction Process of High-Accuracy Mode)

In the embodiment, the control device 70 applies the mounting positions Pm1 to Pm3 as "predetermined processing position within the component mounting machine", applies the mounting angles Am1 to Am3 as "processing angle of the holding member", and executes the mounting process (S30) in the high-accuracy mode. On the other hand, the control device 70 may apply the operation in the high-accuracy mode to the suction process (S14) for sucking the electronic component T1. In this case, the control device 70 applies the suction position as "predetermined processing position within the component mounting machine" and applies the suction angle as "processing angle of the holding member".

In a case where the suction process (S14) is executed in the normal mode, the control device 70 positions the suction nozzle 46 at the suction position which is set in the electronic component T1 supplied to the supply position Ps and angle-positions the suction nozzle 46 at the suction angle which is set in the electronic component T1. Moreover, in a case where the suction position is not set, for example, in a case where the center of the outer shape is the suction position and the suction angle is not set, suction is allowed at an arbitrary suction angle.

However, in the electronic component T1 of the mounting object as the LED element 80, in a case where the suction position is set to be eccentric from the center of the outer shape or the centroid position, it is required to further accurately position the suction nozzle 46 at the suction position. In addition, in a case where the dedicated nozzle 60 having an anisotropic lower face shape is used for suction of the electronic component T1, the dedicated nozzle 60 is required to be further accurately angle-positioned at the suction angle which is set in the electronic component T1.

Therefore, in the suction process (S14) of the high-accuracy mode, the control device 70 transfers the electronic component T1 to the imaging state bypassing through the preparation state and the electronic component T1 is sucked and held by the dedicated nozzle 60. Specifically, the control device 70 acquires the suction position (corresponding to "processing position") and the suction angle (corresponding to "processing angle") which are set in advance with respect to the electronic component T1.

Moreover, the suction position and the suction angle are set as the relative position and the relative angle with respect to the characteristic section on the upper face of the electronic component T1. In such a case, the control device 70 determines the suction position and the suction angle based on the characteristic section acquired in the processing of the TVR control. Specifically, the control device 70 acquires the suction position of the dedicated nozzle 60 which is positioned when the electronic component T1 is sucked based on the image data acquired by imaging (S12) the upper face of the electronic component T1 supplied to the supply position Ps as the processing position. Similarly, the control device 70 acquires the suction angle of the dedicated nozzle 60 which is angle-positioned when the electronic component T1 is held based on the image data acquired by imaging (S12) the upper face of the electronic component T1 supplied to the supply position Ps as the processing angle.

In a case where the dedicated nozzle 60 is moved from the current position Pc to the suction position, the control device 70 moves the dedicated nozzle 60 to the preparation position corresponding to the suction position and then moves the dedicated nozzle 60 from the preparation position to the suction position. In addition, in a case where the dedicated nozzle 60 is rotated from the current angle Ac to the suction angle, the control device 70 causes the dedicated nozzle 60 to rotate to the preparation angle corresponding to the suction position and then causes the dedicated nozzle 60 to rotate from the preparation angle to the suction angle. Thereafter, the control device 70 lowers the dedicated nozzle 60 while supplying the negative pressure air and causes the dedicated nozzle 60 to suck the electronic component T1.

Therefore, in a case where the operation of the high-accuracy mode is applied to the suction process (S14) of the electronic component T1 regarding the propelling axis (XY-axis) and the rotation axis (θ-axis) as the objects, errors of positioning of the suction nozzle 46 in the XY-axis direction and positioning of angle of the θ-axis in the circumferential direction in the suction state are reduced. Therefore, even in a case where the electronic component T1 in which the suction position and the suction angle are set is the object, it is possible to improve accuracy of the suction process (S14) regarding the electronic component T1 as the object.

In addition, in the above-described configuration, the suction nozzle 46 is the dedicated nozzle 60 which sucks and holds the electronic component T1 (LED element 80) whose suction position is set at a position eccentric from the center of the outer shape or the centroid position of the electronic component T1 on the upper face of the electronic component T1. In addition, the suction nozzle 46 is the dedicated nozzle 60 which sucks and holds the electronic component T1 (LED element 80) whose suction angle is limitedly set in a predetermined angle range with respect to the reference of the electronic component T1. According to the configuration, the electronic component T1 can be reliably held by being sucked by using the dedicated nozzle 60 regarding the electronic component T1 such as the LED element 80, which cannot be in contact with and suck a portion in the vicinity of the center of the outer shape or the centroid position on the upper face of the electronic component T1, as the object. In addition, in a case where the dedicated nozzle 60 has an anisotropic lower face shape, it is highly necessary to further accurately position and angle-position the dedicated nozzle 60 with respect to the suction position and the suction angle of the electronic component T1. Therefore, it is particularly useful to perform the high-the suction process (S14) using the dedicated nozzle 60 in the high-accuracy mode.

(Holding Member)

In the embodiment, the holding member adopts the suction nozzle 46 (including the dedicated nozzle 60) that sucks and holds the electronic component T1 to which the negative pressure air is supplied. On the other hand, the component mounting machine 1 may adopt a gripping device that holds the electronic component T1 by gripping the electronic component T1 by a chuck as the holding member. Also in such a configuration, the same effects as those of the embodiment can be obtained.

REFERENCE SIGNS LIST

1: component mounting machine, 30: component transfer device, 31: head driving device, 40: mounting head, 46: suction nozzle (holding member), 60: dedicated nozzle (holding member), 61: cylindrical section, 62: nozzle main body, 63: suction surface, 63a: opening section, 64: retraction section, 65: auxiliary surface, 70: control device, 71: mounting control section, 80: LED element (electronic component), 81: component main body, 82: light emitting section, 83: electrode section, Bd: circuit board, T1: electronic component, Ps: supply position, LPx: defined distance (of X-axis direction), LPy: defined distance (of Y-axis direction), APθ: defined angle (of θ-axis direction), Pc: current position, Ac: current angle, Pm1 to Pm3: mounting position (in mounting process of high-accuracy mode), Pr1 to Pr3: preparation position (in mounting process of high-accuracy mode), fPm1 to fPm3: mounting position (in calibration processing), fPr1 to fPr3: preparation position (in calibration processing), Am1 to Am3: mounting angle (in mounting process of high-accuracy mode), Ar1 to Ar3: preparation angle (in mounting process of high-accuracy mode), fAm1 to fAm3: mounting angle (in calibration processing), fAr1 to fAr3: preparation angle (in calibration processing)

The invention claimed is:

1. A control device operatively connected with a component mounting machine including a camera and a component transfer device which includes a holding member that holds an electronic component and that transfers the electronic component from a supply position to a mounting position on a circuit board, the control device comprising:
a motor control circuit operatively connected to the component transfer device, the motor control circuit configured to control a moving table of the component transfer device to effect a moving operation of the holding member in a plane defined by a first axis and a second axis, the motor control circuit moves the holding member to a preparation position which is set to a defined propelling direction and distance in each of the first axis and the second axis with respect to a processing position, and then moves the holding member from the preparation position to a processing position in a case where motor control circuit controls the moving table to move the holding member in the plane from a current position to a predetermined processing position within the component mounting machine; and
a mounting control section that controls a position of the component transfer device or an operation of the holding member via the motor control circuit, the mounting control section performs calibration processing in advance for acquiring a calibration value with respect to an axial direction in the plane and a distance of a propelling axis regarding the propelling axis which is displaced when the holding member is moved from the preparation position to the processing position by the motor control circuit, and the defined propelling direction and distance is set to the axial direction and the distance of the propelling axis in which the holding member is moved in the calibration processing.

2. The control device of a component mounting machine according to claim 1,
wherein the processing position includes the mounting position on the circuit board,
wherein the motor control circuit controls the moving operation of the holding member according to a control program indicating an order of transferring the electronic component to multiple mounting positions, and
wherein the control program is configured to be optimized in the order of transferring the electronic component based on a movement amount or a movement time of the holding member according to the movement of the holding member by the moving table to each of the preparation positions corresponding to the multiple mounting positions.

3. The control device of a component mounting machine according to claim 1,
wherein the preparation position is set by the mounting control section to the defined propelling direction and distance with respect to the processing position calibrated using the calibration value.

4. The control device of a component mounting machine according to claim 1,
wherein the motor control circuit temporarily stops the movement of the holding member in the propelling direction when the holding member is moved to the preparation position.

5. The control device of a component mounting machine according to claim 1,
wherein the motor control circuit limits a movement speed of the holding member in the propelling direction in a certain range when the holding member is moved to the preparation position.

6. The control device of a component mounting machine according to claim 1,
wherein the mounting control section includes control information indicating whether it is a high-accuracy mode in which the holding member passes through the preparation position or a normal mode in which the holding member is not required to pass through the preparation position when the holding member is moved from the current position to the processing position, and
wherein the mounting control section controls the moving operation of the holding member via the motor control circuit by switching the high-accuracy mode and the normal mode based on the control information when the holding member is sequentially moved to multiple processing positions.

7. The control device of a component mounting machine according to claim 1,
wherein the motor control circuit controls a rotation operation of the holding member, and
in a case where the holding member is rotated from a current angle to a predetermined processing angle, the motor control circuit causes the holding member to rotate to a preparation angle which is set to a defined rotational direction and angle with respect to the processing angle and then causes the holding member to rotate from the preparation angle to the processing angle.

8. A control device operatively connected with a component mounting machine including a camera and a component transfer device which includes a holding member which is a suction nozzle that sucks an upper face of an electronic component to hold the electronic component, and that transfers the electronic component from a supply position to a mounting position on a circuit board, the control device comprising:
a motor control circuit operatively connected to the component transfer device, the motor control circuit configured to control a moving table of the component transfer device to effect a moving operation of the holding member in a plane defined by a first axis and a second axis, the motor control circuit moves the holding member to a preparation position which is set to a defined propelling direction and distance in each of the first axis and the second axis with respect to a processing position, and then moves the holding member from the preparation position to the processing position in a case where motor control circuit controls the moving table to move the holding member in the plane from a current position to a predetermined processing position within the component mounting machine; and
an imaging control circuit operatively connected to the camera, the imaging control circuit configured to acquire a suction position of the suction nozzle which is positioned when the electronic component is sucked as the processing position based on image data acquired by imaging the upper face of the electronic component supplied to the supply position with the camera, and in a case where the suction nozzle is moved from the current position to the suction position by the motor control circuit, the motor control circuit moves the suction nozzle to the preparation position corresponding to the suction position and then moves the suction nozzle from the preparation position to the suction position.

9. The control device of a component mounting machine according to claim 8, wherein the suction nozzle is a dedicated nozzle which sucks and holds the electronic component whose suction position is set at a position eccentric from a center of the outer shape or a centroid position of the electronic component on the upper face of the electronic component.

10. A control method of controlling a component mounting machine including a camera and a component transfer device which includes a holding member that holds an electronic component and that transfers the electronic component from a supply position to a mounting position on a circuit board, the method comprising:

controlling a motor control circuit operatively connected to the component transfer device, the motor control circuit configured to control a moving table of the component transfer device to effect a moving operation of the holding member in a plane defined by a first axis and a second axis;

controlling the motor control circuit to control the moving table to move the holding member in the plane from a current position to a predetermined processing position within the component mounting machine, by moving the holding member to a preparation position which is set to a defined propelling direction and distance in each of the first axis and the second axis with respect to the processing position, and then moves the holding member from the preparation position to the processing position;

controlling a position of the component transfer device or an operation of the holding member via the motor control circuit;

performing calibration processing in advance for acquiring a calibration value with respect to an axial direction in the plane and a distance of a propelling axis regarding the propelling axis which is displaced when the holding member is moved from the preparation position to the processing position by the motor control circuit; and setting the defined propelling direction and distance to the axial direction and the distance of the propelling axis in which the holding member is moved in the calibration processing.

* * * * *